US012707838B2

(12) United States Patent
Cai et al.

(10) Patent No.: US 12,707,838 B2
(45) Date of Patent: Aug. 11, 2026

(54) DISPLAY SUBSTRATE COMPRISING CONDUCTIVE LAYERS, MANUFACTURING METHOD THEREFOR, AND DISPLAY APPARATUS COMPRISING THE DISPLAY SUBSTRATE

(71) Applicants: Chengdu BOE Optoelectronics Technology Co., Ltd., Chengdu (CN); BOE Technology Group Co., Ltd., Beijing (CN)

(72) Inventors: Jianchang Cai, Beijing (CN); Qing Tang, Beijing (CN); Yu Zhao, Beijing (CN); Yanwei Lu, Beijing (CN); Jianmin Fan, Beijing (CN); Binyan Wang, Beijing (CN); Yue Long, Beijing (CN); Weiyun Huang, Beijing (CN); Zhuoran Yan, Beijing (CN); Yifei Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 374 days.

(21) Appl. No.: 18/269,956

(22) PCT Filed: Dec. 27, 2021

(86) PCT No.: PCT/CN2021/141666

§ 371 (c)(1),
(2) Date: Jun. 28, 2023

(87) PCT Pub. No.: WO2023/122888

PCT Pub. Date: Jul. 6, 2023

(65) Prior Publication Data

US 2024/0397763 A1 Nov. 28, 2024

(51) Int. Cl.
*H10K 59/131* (2023.01)
*H10H 20/01* (2025.01)
(Continued)

(52) U.S. Cl.
CPC ......... *H10K 59/131* (2023.02); *H10H 20/857* (2025.01); *H10K 59/1201* (2023.02);
(Continued)

(58) Field of Classification Search
CPC ............. H10K 59/131; H10K 59/1201; H10K 59/126; H10K 71/60; H10H 20/857; H10H 20/0364
(Continued)

(56) References Cited

U.S. PATENT DOCUMENTS

2002/0154235 A1 10/2002 Kim
2004/0108985 A1 6/2004 Song
(Continued)

FOREIGN PATENT DOCUMENTS

CN 101706637 A 5/2010
CN 202563478 U 11/2012
(Continued)

OTHER PUBLICATIONS

EP Search Report for 21969275.3 Mailed Jul. 16, 2024.
(Continued)

*Primary Examiner* — Eric W Jones

(57) ABSTRACT

A display substrate comprises a base substrate, a first conductive layer, a first planarization layer, a second conductive layer, a second planarization layer and at least one transparent conductive layer. The second conductive layer is electrically connected with the first conductive layer through at least one first via penetrating the first planarization layer. The transparent conductive layer includes at least one first transparent conductive line and at least one auxiliary trace.
(Continued)

An orthographic projection of the first transparent conductive line on the base substrate is overlapped with an orthographic projection of the at least one first via on the base substrate. At least a portion of the auxiliary traces are in the same direction as an extension direction of the first transparent conductive line, and an orthographic projection of the auxiliary traces on the base substrate is adjacent to an orthographic projection of the first via on the base substrate.

19 Claims, 14 Drawing Sheets

(51) Int. Cl.
*H10H 20/857* (2025.01)
*H10K 59/12* (2023.01)
*H10K 59/126* (2023.01)
*H10K 71/60* (2023.01)

(52) U.S. Cl.
CPC .......... *H10K 59/126* (2023.02); *H10K 71/60* (2023.02); *H10H 20/0364* (2025.01)

(58) Field of Classification Search
USPC .......................... 257/40, 59, 88, 91, 99, 100
See application file for complete search history.

(56) References Cited

U.S. PATENT DOCUMENTS

2010/0320472 A1 12/2010 Liu
2014/0231778 A1* 8/2014 Koshihara ............ H10K 59/876 257/40
2018/0122882 A1 5/2018 Lee et al.
2018/0287093 A1 10/2018 Lee et al.
2020/0127071 A1 4/2020 Chen
2021/0104590 A1 4/2021 Kim et al.
2021/0210584 A1* 7/2021 Youn ...................... H10K 59/80
2022/0069023 A1* 3/2022 Lou ...................... H10K 59/122
2022/0093894 A1 3/2022 Song et al.
2022/0336563 A1* 10/2022 Cho ..................... G09G 3/3241
2023/0153498 A1* 5/2023 Liu ....................... G02F 1/1368 716/135

FOREIGN PATENT DOCUMENTS

CN 108122944 A 6/2018
CN 108831906 A 11/2018
CN 208225026 U 12/2018
CN 110610980 A 12/2019
CN 112103326 A 12/2020
CN 113823671 A 12/2021
EP 3125294 A 7/2016
KR 20180013413 A 2/2018
WO 2021147082 A1 7/2021
WO 2021238486 A1 12/2021
WO 2021239112 A1 12/2021

OTHER PUBLICATIONS

International Search Report for PCT/CN2021/141666 Mailed Jul. 22, 2022.
Chinese First Office Action for Application No. 202180004215.9, dated Jun. 24, 2026, with English translation, 20 pgs.

* cited by examiner

DISPLAY SUBSTRATE COMPRISING CONDUCTIVE LAYERS, MANUFACTURING METHOD THEREFOR, AND DISPLAY APPARATUS COMPRISING THE DISPLAY SUBSTRATE

CROSS-REFERENCE TO RELATED APPLICATION

The present application is a U.S. National Phase Entry of International Application PCT/CN2021/141666 having an international filing date of Dec. 27, 2021, and entitled "Display Substrate, Manufacturing Method Therefor, and Display Apparatus", the contents of the above-identified application are incorporated herein by reference.

TECHNICAL FIELD

The present disclosure relates to, but is not limited to, the field of display technologies, and particularly to a display substrate and a method for manufacturing the display substrate, and a display apparatus.

BACKGROUND

An Organic Light Emitting Diode (OLED) and a Quantum dot Light Emitting Diode (QLED) are active light emitting display devices and have advantages such as self-illumination, wide viewing angle, high contrast ratio, low power consumption, very high reaction speed, lightness and thinness, bendability, and low cost.

SUMMARY

The following is a summary of subject matter described herein in detail. The summary is not intended to limit the protection scope of claims.

Embodiments of the present disclosure provide a display substrate, a method for manufacturing the display substrate, and a display apparatus.

In one aspect, an embodiment of the present disclosure provides a display substrate including a base substrate, a first conductive layer located on the base substrate, a first planarization layer located on a side of the first conductive layer away from the base substrate, a second conductive layer located on a side of the first planarization layer away from the base substrate, a second planarization layer located on a side of the second conductive layer away from the base substrate, and at least one transparent conductive layer located on a side of the second planarization layer away from the base substrate. The second conductive layer is electrically connected with the first conductive layer through at least one first via penetrating the first planarization layer. The at least one transparent conductive layer includes at least one first transparent conductive line and at least one auxiliary trace. An orthographic projection of the at least one first transparent conductive line on the base substrate is overlapped with an orthographic projection of the at least one first via on the base substrate. At least a portion of the at least one auxiliary traces are in a same direction as an extension direction of the at least one first transparent conductive line, and an orthographic projection of an auxiliary trace on the base substrate is adjacent to an orthographic projection of a first via of the at least one via on the base substrate.

In some exemplary implementations, a length of the auxiliary trace along the extension direction is greater than an aperture of the first via along the extension direction.

In some exemplary implementations, a spacing between edges of the auxiliary trace and the first via at the same side is less than 5 microns in the extension direction.

In some exemplary implementations, an absolute value of a difference between a line width of the auxiliary trace along an intersection direction of the extension direction and a line width of a first transparent conductive line along the intersection direction of the extension direction is less than or equal to 0.3 microns.

In some exemplary implementations, a first spacing is formed between the auxiliary trace and a first transparent conductive line in an intersection direction of the extension direction, and an absolute value of a difference between the first spacing and a line width of the first transparent conductive line in the intersection direction of the extension direction is less than or equal to 0.35 microns.

In some exemplary implementations, the auxiliary trace has a length of 13.5 microns to 16.5 microns along the extension direction; a line width of the auxiliary trace along the intersection direction of the extension direction is 1.9 microns to 2.4 microns; and a first spacing between the auxiliary trace and a first transparent conductive line is 2.1 microns to 2.6 microns along the intersection direction of the extension direction.

In some exemplary implementations, an orthographic projection of an end of the auxiliary trace in the extension direction on the base substrate has a circular arc shape.

In some exemplary implementations, the at least one transparent conductive layer includes a first transparent conductive layer. The first transparent conductive layer further includes at least one third anode connection electrode, and the at least one auxiliary trace includes a first auxiliary trace. The first auxiliary trace and the third anode connection electrode are in an integral structure, and the third anode connection electrode is configured to be electrically connected with a second anode connection electrode of the second conductive layer.

In some exemplary implementations, the at least one transparent conductive layer further includes a second transparent conductive layer located on a side of the at least one first transparent conductive layer away from the base substrate. The second transparent conductive layer includes a second auxiliary trace and at least one fourth anode connection electrode. The second auxiliary trace and the at least one fourth anode connection electrode are in an integral structure.

In some exemplary implementations, the at least one transparent conductive layer further includes a third transparent conductive layer located on a side of the second transparent conductive layer away from the base substrate. The third transparent conductive layer includes a third auxiliary trace and at least one fifth anode connection electrode. The third auxiliary trace and the at least one fifth anode connection electrode are in an integral structure.

In some exemplary implementations, the at least one transparent conductive layer further includes a plurality of second transparent conductive lines arranged adjacent to each other. An orthographic projection of the plurality of second transparent conductive lines on the base substrate is overlapped with an orthographic projection of the second conductive layer on the base substrate. The plurality of second transparent conductive lines include two marginal transparent conductive lines and at least one non-marginal transparent conductive line, wherein the at least one non-marginal transparent conductive line is located between the two marginal transparent conductive lines. A line width of a marginal transparent conductive line along the intersection direction of the extension direction is larger than a line width of a non-marginal transparent conductive line along the intersection direction of the extension direction.

In some exemplary implementations, an absolute value of a difference between the line width of the marginal transparent conductive line along the intersection direction of the extension direction and the line width of the non-marginal transparent conductive line along the intersection direction of the extension direction is 0.3 microns to 0.5 microns.

In some exemplary implementations, the marginal transparent conductive line has a line width of 2.0 microns to 2.5 microns along the intersection direction of the extension direction, and the non-marginal transparent conductive line has a line width of 1.8 microns to 2.2 microns along the intersection direction of the extension direction.

In some exemplary implementations, the at least one transparent conductive layer further includes at least one third transparent conductive line, wherein an orthographic projection of the at least one third transparent conductive line on the base substrate is overlapped with the orthographic projection of the second conductive layer on the base substrate, and a spacing between the third transparent conductive line and other transparent conductive lines is greater than 4 microns. A line width of a third transparent conductive line along the intersection direction of the extension direction is larger than the line width of the marginal transparent conductive line along the intersection direction of the extension direction.

In some exemplary implementations, the at least one transparent conductive layer further includes at least one fourth transparent conductive line and at least one fifth transparent conductive line. A line length of the at least one fourth transparent conductive line along the extension direction is larger than a line length of the at least one fifth transparent conductive line along the extension direction, and a line width of a fourth transparent conductive line of the at least one fourth transparent conductive line along the intersection direction of the extension direction is smaller than a line width of a fifth transparent conductive line of the at least one fifth transparent conductive line along the intersection direction of the extension direction.

In some exemplary implementations, an orthographic projection of the fourth transparent conductive line on the base substrate is overlapped with an orthographic projection of a first number of first vias on the base substrate, and an orthographic projection of the fifth transparent conductive line on the base substrate is overlapped with an orthographic projection of a second number of first vias on the base substrate, wherein the first number is greater than the second number.

In some exemplary implementations, a ratio of a length of an overlapping region in the intersection direction of the extension direction to the line width of the transparent conductive line is greater than or equal to 0.5, wherein the overlapping region is a region where an orthographic projection of any one of the fourth transparent conductive line and the fifth transparent conductive line on the base substrate is overlapped with an orthographic projection of the first vias on the base substrate.

In some exemplary implementations, an overlapping area between an orthographic projection of the fourth transparent conductive line on the base substrate and an orthographic projection of the second conductive layer on the base substrate is greater than an overlapping area between an orthographic projection of the fifth transparent conductive line on the base substrate and an orthographic projection of the second conductive layer on the base substrate.

In some exemplary implementations, a material of the second conductive layer is a transparent conductive material.

In some exemplary implementations, the second conductive layer includes a shielding electrode electrically connected to a first power supply line, and an orthographic projection of the shielding electrode on the base substrate is configured to cover an orthographic projection of a first node of a pixel circuit of the display substrate on the base substrate. The orthographic projection of the shielding electrode on the base substrate has a regular shape.

In some exemplary implementations, an orthographic projection of the shielding electrode on the base substrate is a rectangle or a rounded rectangle.

In some exemplary implementations, the shielding electrodes of adjacent pixel circuit are in an integral structure.

In some exemplary implementations, the display substrate includes a first display region and a second display region, wherein the first display region at least partially surrounds the second display region. The display substrate further includes a plurality of sub-pixels, wherein at least one sub-pixel includes a pixel circuit and a light emitting element, and the pixel circuit is configured to drive the light emitting element. The plurality of sub-pixels include at least one first sub-pixel and at least one second sub-pixel, wherein the pixel circuit and the light emitting element of the at least one first sub-pixel are located in the first display region, the pixel circuit of the at least one second sub-pixel is located in the first display region, the light emitting element of the at least one second sub-pixel is located in the second display region, and the pixel circuit of the at least one second sub-pixel is electrically connected with the light emitting element of the at least one second sub-pixel through the at least one transparent conductive layer.

In another aspect, an embodiment of the present disclosure provides a display apparatus including any of the display substrates as described above.

In another aspect, an embodiment of the present disclosure provides a method for manufacturing a display substrate, including: forming a first conductive layer on the base substrate; forming a first planarization layer on a side of the first conductive layer away from the base substrate; forming a second conductive layer on a side of the first planarization layer away from the base substrate, wherein the second conductive layer is electrically connected with the first conductive layer through at least one first via penetrating the first planarization layer; forming a second planarization layer on a side of the second conductive layer away from the base substrate; and forming at least one transparent conductive layer on a side of the second planarization layer away from the base substrate. The transparent conductive layer includes: at least one first transparent conductive line and at least one auxiliary trace, wherein an orthographic projection of the at least one first transparent conductive line on the base substrate is overlapped with an orthographic projection of the at least one first via on the base substrate. At least a portion of the at least one auxiliary trace is in a same direction as an extension direction of the at least one first transparent conductive line, and an orthographic projection of an auxiliary trace on the base substrate is adjacent to an orthographic projection of a first via of the at least one via on the base substrate.

Other aspects may be understood upon reading and understanding of the drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1A:
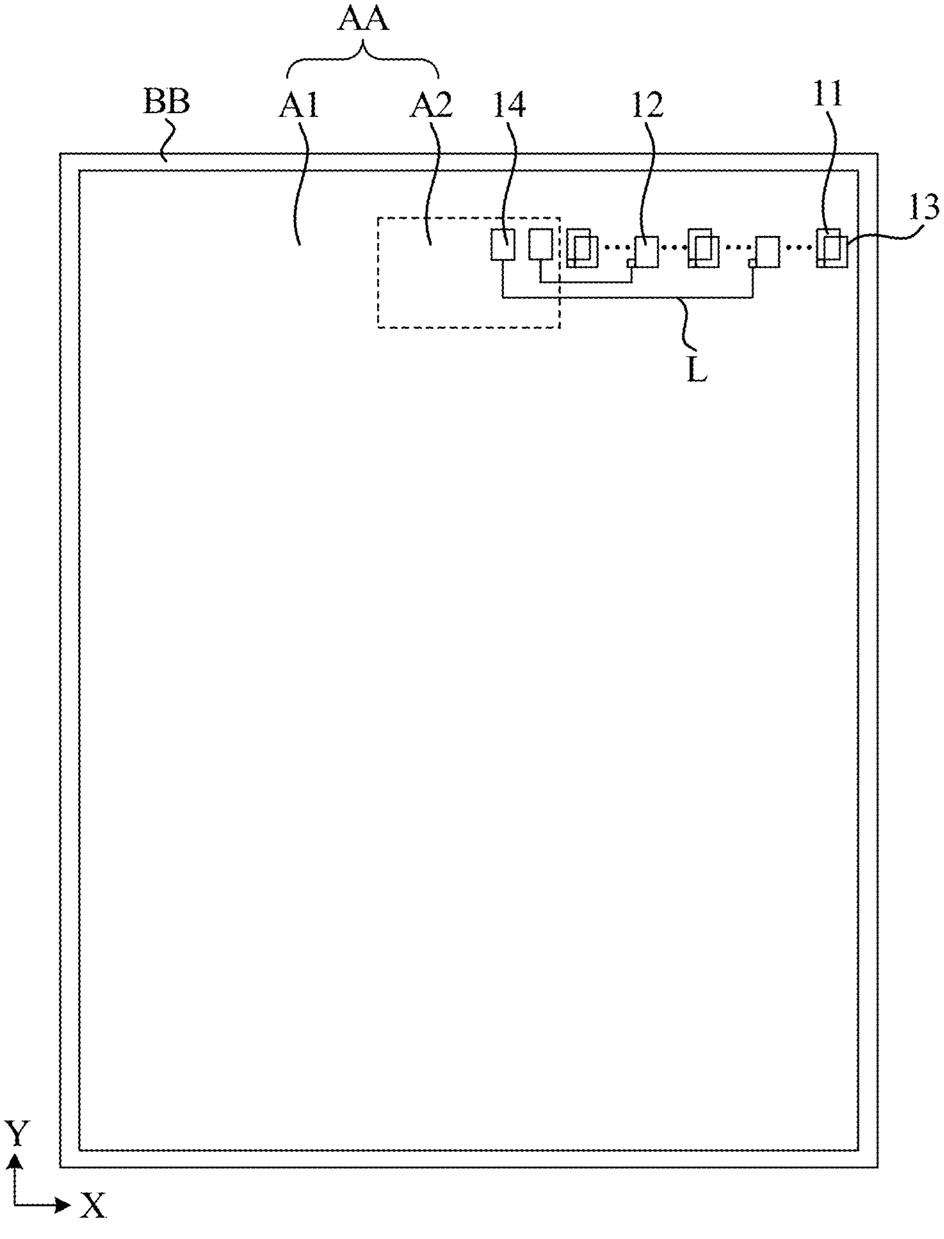
FIG. 1A is a schematic diagram of a display substrate according to at least one embodiment of the present disclosure.

The embodiments of the present disclosure will be described below with reference to the drawings in detail. Implementations may be practiced in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the drawings schematically illustrate ideal examples, and one implementation of the present disclosure is not limited to shapes, numerical values, or the like shown in the drawings.

Ordinal numerals such as "first", "second", and "third" in the specification are set to avoid confusion between constituent elements, but not to set a limit in quantity. In the present disclosure, "plurality/multiple" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction according to which the constituent elements are described. Therefore, appropriate replacements may be made according to situations without being limited to the wordings described in the specification.

In this specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct connection, an indirect connection through an intermediate component, or internal communication between two components. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical effect" is not particularly limited as long as electrical signals between the connected constituent elements may be transmitted. Examples of the "element with the certain electrical effect" not only include an electrode and a wiring, but also include a switching element such as a transistor, a resistor, an inductor, a capacitor, another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, a first electrode may be a drain electrode and a second electrode may be a source electrode, or, the first electrode may be a source electrode and the second electrode may be a drain electrode. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification. In addition, the gate electrode may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° 85° and below 95°.

A "light transmission rate" in the present disclosure refers to an ability of light passing through a medium, and is a percentage of luminous flux passing through a transparent or translucent body to its incident luminous flux.

In the present disclosure, "about" and "substantially" refer to that a boundary is not defined strictly and a case within a range of a process and measurement error is allowed. In the present disclosure, "substantially the same" refers to a case where values differ by less than 10%.

In the present disclosure, "line length" represents a length in an extension direction of the line, and "line width" represents a length in an intersection direction (e.g., a direction perpendicular to the extension direction) of the extension direction of the line in a plane where the line is located.

The embodiment of the present disclosure provides a display substrate, which includes a base substrate, a first conductive layer, a first planarization layer, a second conductive layer, a second planarization layer and at least one transparent conductive layer which are located on the base substrate. The second conductive layer is electrically connected with the first conductive layer through at least one first via penetrating the first planarization layer. The at least one transparent conductive layer includes at least one first transparent conductive line and at least one auxiliary trace. An orthographic projection of the at least one first transparent conductive line on the base substrate is overlapped with an orthographic projection of the at least one first via on the base substrate. At least a portion of the at least one auxiliary trace is in the same direction as an extension direction of the first at least one transparent conductive line, and an orthographic projection of the at least one auxiliary trace on the base substrate is adjacent to an orthographic projection of the at least one first via on the base substrate.

In some exemplary implementations, the display substrate may include one transparent conductive layer or may include a plurality of transparent conductive layers (e.g. three transparent conductive layers). For example, each transparent conductive layer of the plurality of transparent conductive layers may include a first transparent conductive line and an auxiliary trace, or at least one transparent conductive layer of the plurality of transparent conductive layers may include a first transparent conductive line and an auxiliary trace. However, this embodiment is not limited thereto.

The display substrate according to this embodiment may improve an exposure environment of an exposure process of a transparent conductive layer by arranging auxiliary traces around the first transparent conductive line, thereby improving a situation that the transparent conductive layer is in disconnection or its line width is thinned because of reflection and focusing effects of the second conductive layer in the exposure process.

In some exemplary implementations, a length of an auxiliary trace along the extension direction may be greater than an aperture of a first via along the extension direction. In the extension direction, spacing between the auxiliary trace and an edge of the first via on a same side may be less than 5 microns (um). In this example, by arranging the auxiliary trace, amount of entering light in the exposure process and an etching amount during etching of the transparent conductive layer may be improved, thereby improving the situation that the transparent conductive layer is in disconnection or its line width is thinned.

In some exemplary implementations, an absolute value of a difference between a line width of the auxiliary trace along an intersection direction of the extension direction and a line width of the first transparent conductive line along the intersection direction of the extension direction may be less than or equal to 0.3 microns. There is a first spacing between the auxiliary trace and the first transparent conductive line along the intersection direction of the extension direction, and an absolute value of a difference between the first spacing and the line width of the first transparent conductive line in the intersection direction of the extension direction may be less than or equal to 0.35 microns. In some examples, a length of the auxiliary trace along the extension direction may be about 13.5 microns to 16.5 microns, for example, may be about 15 micron. The line width of the auxiliary trace along the intersection direction of the extension direction may be about 1.9 microns to 2.4 microns, for example, may be about 2.2 microns. In the intersection direction of the extension direction, the first spacing between the auxiliary trace and the first transparent conductive line may be from about 2.1 microns to 2.6 microns, for example, may be about 2.35 microns. However, this embodiment is not limited thereto.

In some exemplary implementations, an orthographic projection of an end of the auxiliary trace in the extension direction on the base substrate may be in an circular arc shape. In this example, by designing the end of the auxiliary trace to be in a circular arc shape, a mask discharge problem in a preparation process of a transparent conductive layer may be improved, thereby improving the situation that the transparent conductive layer is in disconnection or its line width is thinned.

In some exemplary implementations, the at least one transparent conductive layer may include a first transparent conductive layer. The first transparent conductive layer may include at least one third anode connection electrode. The auxiliary trace may include a first auxiliary trace. The first auxiliary trace and the at least one third anode connection electrode may be in an integral structure. A third anode connection electrode is configured to be electrically connected with a second anode connection electrode of the second conductive layer. However, this embodiment is not limited thereto. For example, the first auxiliary trace and the third anode connection electrode of the first transparent conductive layer may be arranged independently from each other. For example, the first auxiliary trace of the first transparent conductive layer may be electrically connected to a first power supply line or a second power supply line.

In some exemplary implementations, the at least one transparent conductive layer may further include a second transparent conductive layer located on a side of the first transparent conductive layer away from the base substrate. The second transparent conductive layer may include a second auxiliary trace and at least one fourth anode connection electrode, wherein the second auxiliary trace and the at least one fourth anode connection electrode may be in an integral structure. In some examples, a fourth anode connection electrode may be configured to be electrically connected to a third anode connection electrode of the first transparent conductive layer. However, this embodiment is not limited thereto. For example, the fourth anode connection electrode may be configured to be electrically connected to a second anode connection electrode of the second conductive layer. In some other examples, the second auxiliary trace and the fourth anode connection electrode of the second transparent conductive layer may be arranged independently from each other. For example, the second auxiliary traces of the second transparent conductive layer may be electrically connected to the first power supply line or the second power supply line.

In some exemplary implementations, the at least one transparent conductive layer may further include a third transparent conductive layer located on a side of the second transparent conductive layer away from the base substrate. The third transparent conductive layer may include a third auxiliary trace and at least one fifth anode connection electrode, wherein the third auxiliary trace and the at least one fifth anode connection electrode may be in an integral structure. In some examples, a fifth anode connection electrode may be configured to be electrically connected to a fourth anode connection electrode of the second transparent conductive layer. However, this embodiment is not limited thereto. For example, the fifth anode connection electrode may be configured to be electrically connected to a second anode connection electrode of the second conductive layer. In some other examples, the third auxiliary trace and the fifth anode connection electrode of the third transparent conductive layer may be arranged independently from each other. For example, the third auxiliary trace of the third transparent conductive layer may be electrically connected to the first power supply line or the second power supply line.

In some exemplary implementations, the transparent conductive layer may further include a plurality of second transparent conductive lines arranged adjacent to each other. An orthographic projection of the plurality of second transparent conductive lines on the base substrate is overlapped with an orthographic projection of the second conductive layer on the base substrate. The plurality of second transparent conductive lines may include two marginal transparent conductive lines and at least one non-marginal transparent conductive line. The at least one non-marginal transparent conductive line is located between the two marginal transparent conductive lines. A line width of a marginal transparent conductive line along the intersection direction of the extension direction is larger than a line width of a non-marginal transparent conductive line along the intersection direction of the extension direction. In some examples, at least one of the first transparent conductive layer, the second transparent conductive layer, and the third transparent conductive layer may include a plurality of second transparent conductive lines. In this example, by increasing the line widths of the marginal transparent conductive lines for the plurality of second transparent conductive lines arranged adjacent to each other, the amount of entering light in the exposure process and an etching amount during etching of the transparent conductive layers may be improved, thereby improving line width consistency of the transparent conductive layers.

In some exemplary implementations, an absolute value of a difference between a line width of a marginal transparent conductive line along the intersection direction of the extension direction and a line width of a non-marginal transparent conductive line along the intersection direction of the extension direction may be 0.3 microns to 0.5 microns. For example, the line width of the marginal transparent conductive line along the intersection direction of the extension direction may be about 2.0 microns to 2.5 microns, e.g. may be about 2.3 microns, and the line width of the non-marginal transparent conductive line along the intersection direction of the extension direction may be about 1.8 microns to 2.2 microns, e.g. may be about 2.0 microns. However, this embodiment is not limited thereto.

In some exemplary implementations, the transparent conductive layer may further include at least one third transparent conductive line. An orthographic projection of the at least one third transparent conductive line on the base substrate is overlapped with an orthographic projection of the second conductive layer on the base substrate, and spacing between a third transparent conductive line and the rest transparent conductive lines is greater than 4 microns. A line width of the third transparent conductive line along the intersection direction of the extension direction is larger than a line width of a marginal transparent conductive line along the intersection direction of the extension direction. In some examples, at least one of the first transparent conductive layer, the second transparent conductive layer, and the third transparent conductive layer may include a plurality of second transparent conductive lines. In this example, the third transparent conductive line is arranged separately, and there may be no other adjacent transparent conductive lines, that is, the third transparent conductive line may be an independent single trace. By increasing the line width of the third transparent conductive line for the third transparent conductive line arranged separately, the amount of entering light in the exposure process and the etching amount during etching of the transparent conductive layer may be improved, thereby improving the line width consistency of the transparent conductive layer.

In the present exemplary implementations, in a plane where the transparent conductive lines are located, if there are no other transparent conductive lines within 4 microns of the periphery of any transparent conductive line, this transparent conductive line is considered to have no adjacent transparent conductive lines, that is, the transparent conductive line is a conductive line arranged separately. If spacing between any transparent conductive line and another transparent conductive line is less than or equal to 4 microns, this transparent conductive line is considered to have an adjacent transparent conductive line.

In some exemplary implementations, the transparent conductive layer may further include at least one fourth transparent conductive line and at least one fifth transparent conductive line. A line length of a fourth transparent conductive line along the extension direction is larger than a line length of a fifth transparent conductive line along the extension direction, and a line width of the fourth transparent conductive line along the intersection direction of the extension direction is smaller than a line width of the fifth transparent conductive line along the intersection direction of the extension direction. In some examples, at least one of the first transparent conductive layer, the second transparent conductive layer, and the third transparent conductive layer may include a fourth transparent conductive line and a fifth transparent conductive line. In this example, by adjusting the line lengths and line widths of different transparent conductive lines, the capacitance difference between different transparent conductive lines can be reduced, thereby improving the display effect.

In some exemplary implementations, an orthographic projection of the fourth transparent conductive line on the base substrate is overlapped with an orthographic projection of a first number of first vias on the base substrate, and an orthographic projection of the fifth transparent conductive line on the base substrate is overlapped with an orthographic projection of a second number of first vias on the base substrate, wherein the first number is greater than the second number. In this example, the number of the first via overlapped with the fourth transparent conductive line is larger than the number of the first via overlapped with the fifth transparent conductive line, and the line width of the fourth conductive line may be made smaller than that of the fifth conductive line due to the reflection and focusing effects of the second conductive layer during the preparation of the transparent conductive layer. In this example, by adjusting overlapping areas between the transparent conductive lines and the first vias, the line widths of the transparent conductive lines may be improved to reduce the capacitance difference between different transparent conductive lines.

In some exemplary implementations, an overlapping area between an orthographic projection of the fourth transparent conductive line on the base substrate and an orthographic projection of the second conductive layer on the base substrate is greater than an overlapping area between an orthographic projection of the fifth transparent conductive line on the base substrate and an orthographic projection of the second conductive layer on the base substrate. In this example, during the preparation of the transparent conductive layer, the line width of the fourth conductive line may be made smaller than the line width of the fifth conductive line due to the reflection and focusing effects of the second conductive layer. In this example, by adjusting the overlapping area between the transparent conductive lines and the second conductive layers, the line widths of the transparent conductive lines may be improved to reduce the capacitance difference between different transparent conductive lines.

In some exemplary implementations, a material of the second conductive layer may be a transparent conductive material such as indium tin oxide (ITO). In this example, by providing the material of the second conductive layer as a transparent conductive material, the second conductive layer does not have reflection and focusing effects during the preparation process of the transparent conductive layer, which may improve the situation that the transparent conductive layer is in disconnection or its line width is thinned.

In some exemplary implementations, the second conductive layer includes a shielding electrode. The shielding electrode is electrically connected to the first power supply line, and an orthographic projection of the shielding electrode on the base substrate is configured to cover an orthographic projection of a first node of a pixel circuit of the display substrate on the base substrate. The orthographic projection of the shielding electrode on the base substrate has a regular shape. For example, the orthographic projection of the shielding electrode on the base substrate may be a rectangle or a rounded rectangle. However, this embodiment is not limited thereto. In this example, by arranging the shielding electrode with a regular shape, the influence on the line width of the transparent conductive layer may be reduced, and the capacitance difference of different transparent conductive lines may be reduced, thus improving the display effect.

Solutions of the embodiments will be described below through some examples. A display substrate suitable for full screen and under display camera technology will be described as an example. However, this embodiment is not limited thereto.

Figure 1B:
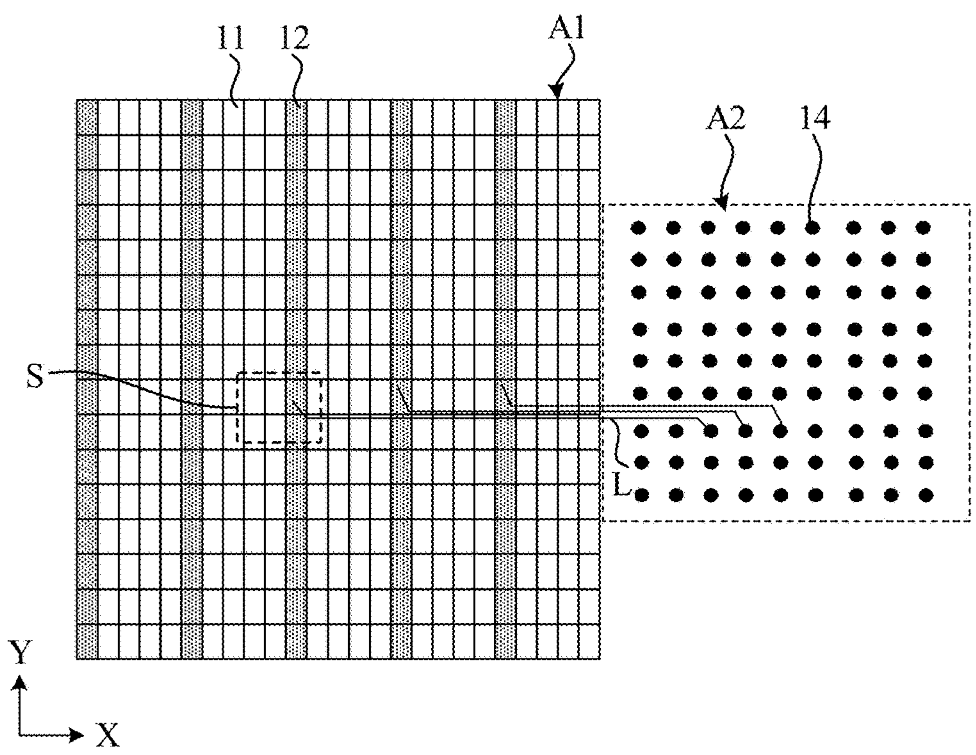
FIG. 1B is a partial schematic view of a display substrate according to at least one embodiment of the present disclosure.

FIG. 1A is a schematic diagram of a display substrate according to at least one embodiment of the present disclosure. FIG. 1B is a partial schematic view of a display substrate according to at least one embodiment of the present disclosure. In some exemplary implementation, as shown in FIG. 1A and FIG. 1B, the display substrate includes a display area AA and a peripheral area BB. The peripheral area BB is a non-display area. The display area AA may include a first display region A1 and a second display region A2. For example, hardware such as a photosensitive sensor (e.g., a camera) is arranged on a side of the display substrate, and an orthographic projection of the photosensitive sensor on the display substrate is overlapped with the second display region A2. The second display region A2 may be a light-transmissive display region and may be referred to as an Under Display Camera (UDC) region. The first display region A1 may be a normal display region. For example, the first display region A1 is not light-transmissive and is only used for display. The display substrate of this embodiment can lay a solid foundation for the implementation of the real full screen.

In some exemplary implementations, as shown in FIG. 1A, the display area AA may be a rectangle, e.g., a rounded rectangle. The second display region A2 may be a rectangle, e.g., a rounded rectangle. However, this embodiment is not limited thereto. For example, the second display region A2 may be a circle, other quadrilateral or pentagon, etc.

In some exemplary implementations, as shown in FIG. 1A, the display substrate may include a base substrate and a plurality of sub-pixels located on the base substrate. The plurality of sub-pixels include a plurality of first sub-pixels and a plurality of second sub-pixels. At least one first sub-pixel includes a first pixel circuit 11 and a first light emitting element 13, and at least one second sub-pixel includes a second pixel circuit 12 and a second light emitting element 14. Both the first pixel circuit 11 and the first light emitting element 13 are located in the first display region A1, the second pixel circuit 12 is located in the first display region A1, and the second light emitting element 14 is located in the second display region A2. A plurality of second pixel circuit 12 may be distributed between a plurality of first pixel circuit 11 at intervals. For example, the first pixel circuit 11 may be referred to as an in-situ pixel circuit and the second pixel circuit 12 may be referred to as a non-in-situ pixel circuit. Within the second display region A2, there is a light-transmissive sub-region between adjacent second light emitting elements 14, and a region where a second light emitting element 14 is located is a display sub-region.

In some exemplary implementations, a shape of a sub-pixel may be a rectangle, a rhombus, a pentagon, or a hexagon. When one pixel unit includes three sub-pixels, the three sub-pixels may be arranged side by side horizontally, side by side vertically, or in a triangular arrangement. When one pixel unit includes four sub-pixels, the four sub-pixels may be arranged side by side horizontally, side by side vertically, or in square-shaped arrangement. However, this embodiment is not limited thereto.

In order to improve light transmittance of the second display region A2, only the light emitting elements may be arranged in the second display region A2, and the pixel circuits for driving the light emitting elements of the second display region A2 may be arranged in the first display region A1. That is, the light transmittance of the second display region A2 is improved by separately arranging the light emitting elements and the pixel circuits. The pixel circuits are not arranged in the second display region A2.

In some exemplary implementation, as shown in FIG. 1A, at least one first pixel circuit 11 of the plurality first pixel circuits 11 may be connected with at least one first light emitting element 13 of the plurality of first light emitting elements 13, and an orthographic projection of at least one first pixel circuit 11 on a base substrate is at least partially overlapped with an orthographic projection of at least one first light emitting element 13 on the base substrate. At least one first pixel circuit 11 may be configured to provide a driving signal to a first light emitting element 13 with which the at least one first pixel circuit is connected to drive the first light emitting element 13 to emit light.

In FIG. 1A, taking an example that the second pixel circuit 11 for driving the second light emitting element 14 to emit light is located in the first display region A1, the display substrate in this example may adopt a pixel circuit compression solution in which sizes of pixel circuits in a first direction X are reduced so that the first pixel circuits 11 and the second pixel circuits 12 can be placed in the first direction X, and the second pixel circuits 12 may be dispersed in the first pixel circuits 11. For example, the first direction X is a row direction, and in a same row of pixel circuits, the second pixel circuits 12 are arranged between the first pixel circuits 11 at intervals. However, this embodiment is not limited thereto. For example, the second pixel circuits 12 may be located in the peripheral region, thereby implementing a solution of external pixel circuit.

In some exemplary implementations, as shown in FIG. 1A, the first display region A1 may be located on at least one side of the second display region A2. For example, the first display region A1 may surround the second display region A2. That is, the second display region A2 may be surrounded by the first display region A1. In some other examples, the second display region A2 may be arranged at other positions, which may be, for example, located at a top middle position of the base substrate, or located at an upper left corner position or an upper right corner position of the base substrate. However, this embodiment is not limited thereto.

In some exemplary implementations, as shown in FIG. 1A and FIG. 1B, at least one second pixel circuit 12 of the plurality of second pixel circuits 12 may be electrically connected with at least one second light emitting element 14 of the plurality of second light emitting elements 14 through a transparent conductive line L. One end of the transparent conductive line L is electrically connected with a second pixel circuit 12, and the other end of the transparent conductive line L is electrically connected with a second light emitting element 14. The transparent conductive line L extends from the first display region A1 to the second display region A2. For example, the transparent conductive line L may extend from the first display region A1 to the second display region A2 along the first direction X. Or, the transparent conductive line L may first extend along the second direction Y in the first display region A1, and then extend along the first direction X to the second display region A2. However, this embodiment is not limited thereto.

In some exemplary implementations, the transparent conductive line L may be made of a transparent conductive material, for example, a conductive oxide material such as indium tin oxide (ITO). However, this embodiment is not limited thereto. In some examples, the transparent conductive lines L may be arranged in a transparent conductive layer, or multiple transparent conductive lines L may be arranged in two or three transparent conductive layers. Each of the transparent conductive lines L may be connected with one second pixel circuit 12 and one second light emitting element 14.

In some exemplary implementations, at least one second pixel circuit 12 is configured to provide a drive signal to at least one second light emitting element 14 electrically connected thereto to drive the at least one second light emitting element 14 to emit light. The at least one second pixel circuit 12 and the at least one second light emitting element 14 are located in different regions, and an orthographic projection of the at least one second pixel circuit 12 on the base substrate is not overlapped with an orthographic projection of the at least one second light emitting element 14 on the base substrate. As shown in FIG. 1A, a second light emitting element 14 and a second pixel circuit 12 electrically connected thereto may be located in a same row. That is, a drive signal of the second light emitting element 14 comes from the second pixel circuit 12 in the same row. For example, pixel circuits of sub-pixels in a same row are electrically connected with a same gate line. However, this embodiment is not limited thereto. For example, the second light emitting element and the second pixel circuit electrically connected thereto may not be in the same row.

Figure 2:
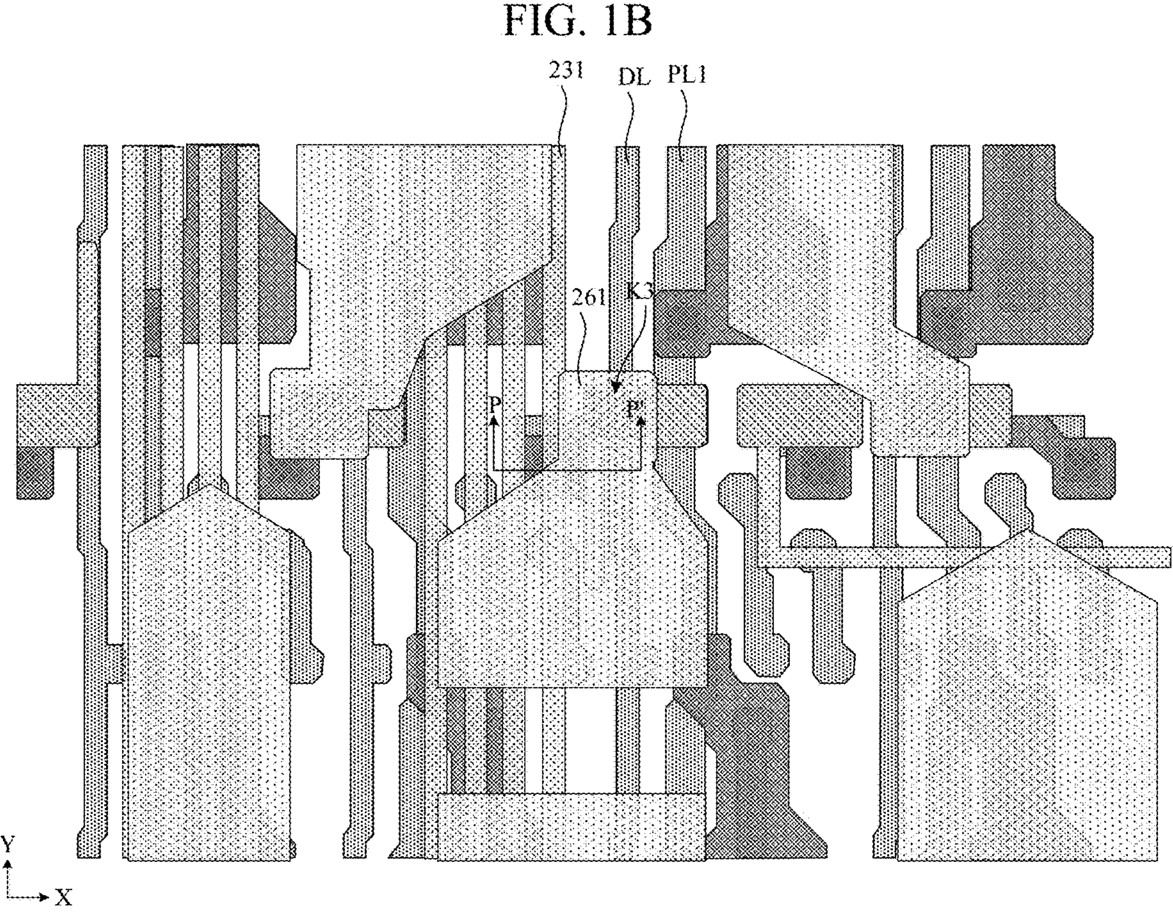
FIG. 2 is a partial top view of a display substrate according to at least one embodiment of the present disclosure.
Figure 3:
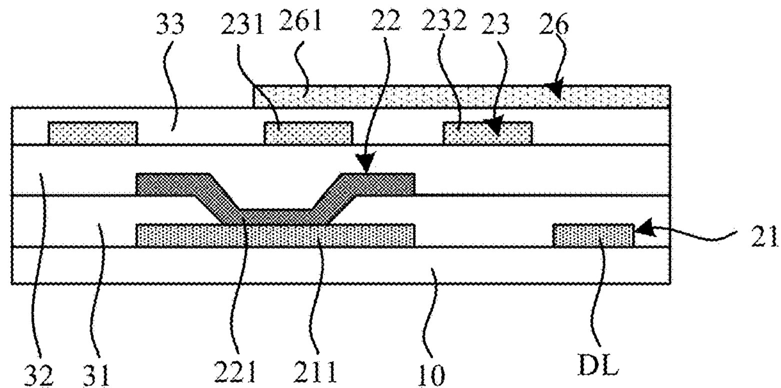
FIG. 3 is a partial cross-sectional view taken along direction P-P' in FIG. 2.
Figure 4:
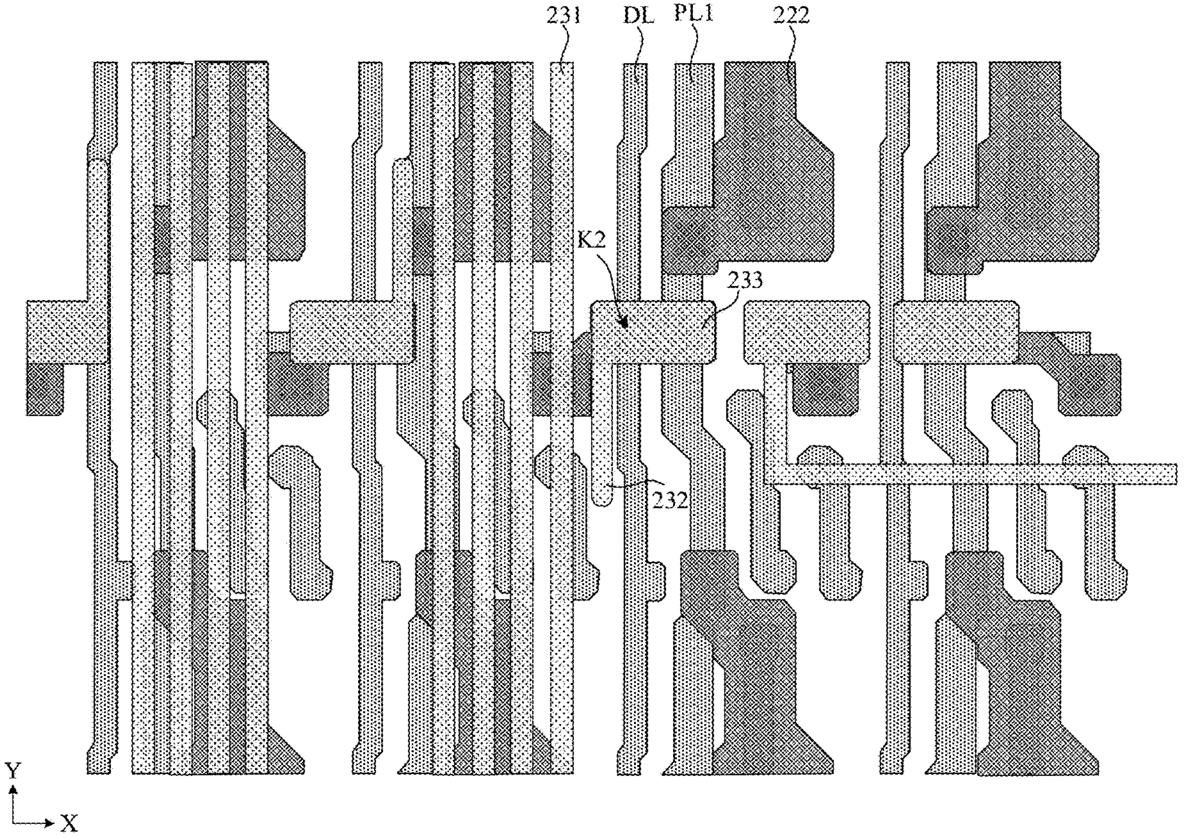
FIG. 4 is a partial top view of a display substrate after a first transparent conductive layer is formed in FIG. 2.
Figure 5:
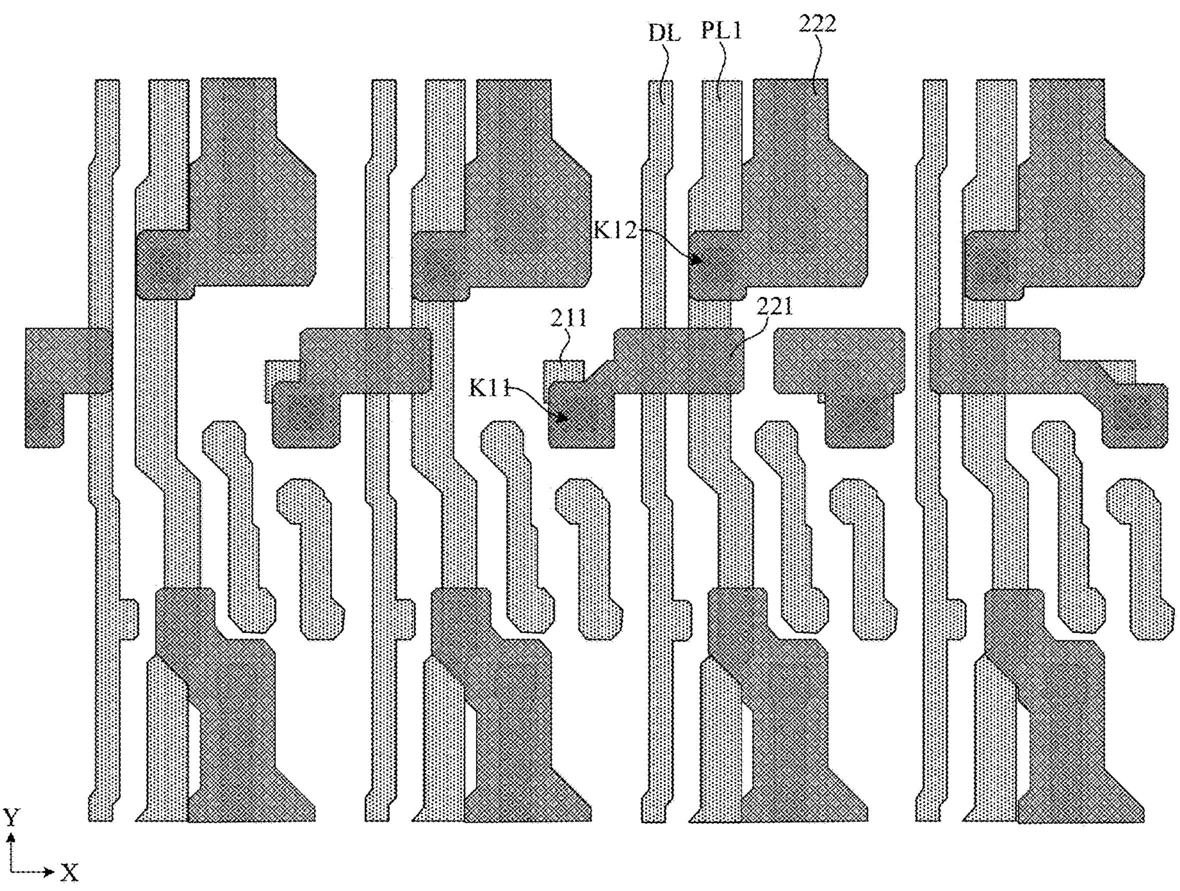
FIG. 5 is a partial top view of a display substrate after a second conductive layer is formed in FIG. 2.

FIG. 2 is a partial top view of a display substrate according to at least one embodiment of the present disclosure. FIG. 2 may be a partial enlarged view of region S in FIG. 1B. FIG. 3 is a partial cross-sectional view taken along direction P-P' in FIG. 2. FIG. 4 is a partial top view of a display substrate after a first transparent conductive layer is formed in FIG. 2. FIG. 5 is a partial top view of a display substrate after a second conductive layer is formed in FIG. 2. A plurality of film layer structures on a side of the first conductive layer close to the display substrate are omitted in FIG. 2 to FIG. 5.

In some exemplary implementations, as shown in FIG. 2 and FIG. 3, in a direction perpendicular to the display substrate, the display substrate of the first display region A1 may include a base substrate 10, a first conductive layer 21, a first planarization layer 31, a second conductive layer 22, a second planarization layer 32, a first transparent conductive layer 23, a third planarization layer 33, and an anode layer 26 that are sequentially arranged on the base substrate 10. In some examples, the first conductive layer 21 may also be referred to as a first source-drain metal layer, and the second conductive layer 22 may also be referred as a second source-drain metal layer. The first planarization layer 31, the second planarization layer 32, and the third planarization layer 33 may be an organic material layer. However, this embodiment is not limited thereto.

In some exemplary implementations, as shown in FIG. 2 to FIG. 5, the first conductive layer 21 may at least include a plurality of data lines (e.g., data lines DL), a plurality of first power supply lines (e.g., first power supply lines PL1), and a plurality of connection electrodes (e.g., first anode connection electrodes 211). The data lines DL and the first power supply lines PL1 may extend along a second direction Y, and a data line DL is adjacent to a first power supply line PL1 in a first direction X. The second conductive layer 22 may at least include a plurality of connection electrodes (e.g. a shielding electrode 222 and a second anode connection electrode 221). The second anode connection electrode 221 may be electrically connected with a first anode connection electrode 211 through a first via K11 formed in the first planarization layer 31. The shielding electrode 222 may be electrically connected to a first power supply line PL1 through a first via K12 formed in the first planarization layer 31. The first transparent conductive layer 23 at least includes a plurality of transparent conductive lines (e.g. a first transparent conductive line 231), at least one auxiliary trace (e.g. a first auxiliary trace 232), and a plurality of connection electrodes (e.g. a third anode connection electrode 233). The third anode connection electrode 233 may be electrically connected with the second anode connection electrode 221 through a second via K2 opened on a second planarization layer 32. The third anode connection electrode 233 and the first auxiliary trace 232 may be in an integral structure. The anode layer 26 may include a plurality of anodes (e.g. an anode 261). The anode 261 may be electrically connected to the third anode connection electrode 233 through a third via K3 formed in the third planarization layer 33.

Figure 6:
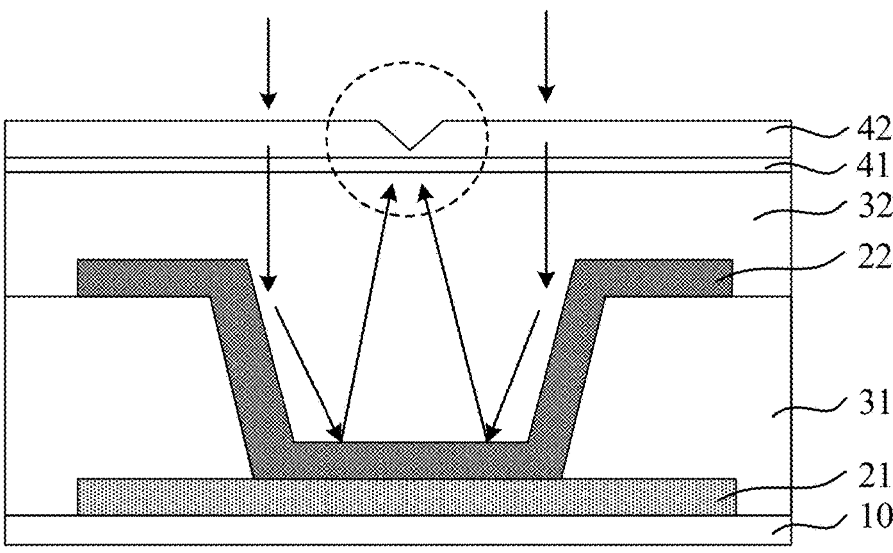
FIG. 6 is a schematic diagram showing a principle of an exposure process during preparation of the first transparent conductive layer in FIG. 2.

FIG. 6 is a schematic diagram showing a principle of an exposure process the preparation of the first transparent conductive layer in FIG. 2. In some implementations, the preparation process of the first transparent conductive layer includes: forming a first transparent conductive thin film 41 on the second planarization layer 32; forming a photoresist thin film 42 on the first transparent conductive thin film 41; exposing the photoresist thin film 42 by using a mask plate as a mask, so that the photoresist thin film forms a portion to be retained of the photoresist and a portion to be removed of the photoresist; and after the exposure process, performing a development process, in which the portion to be removed of the photoresist is removed to form a photoresist pattern. The first transparent conductive thin film 41 is etched by using the photoresist pattern as a mask to form a first transparent conductive layer. However, as shown in FIG. 6, in the exposure process, the second conductive layer 22 made of a metal material reflects light and converges light on the retained portion of the photoresist located above a bowl-shaped portion of the second conductive layer 22, so that this portion of the photoresist is exposed or partially exposed, and is washed away after development, thereby transparent conductive lines formed after etching the first transparent conductive thin film by using the photoresist pattern as a mask is prone to disconnection or becoming thinner. At a position of a via of the first planarization layer 31, due to reflection and focusing effects of the second conductive layer 22 in the exposure process, the photoresist thin film at the position of the via will become thinner, resulting in a disconnection or thinning of the finally formed transparent conductive lines. At an overlapping position between the second conductive layer 22 and the first transparent conductive layer, due to the reflection and focusing effects of the second conductive layer 22 in the exposure process, the photoresist thin film above the second conductive layer 22 will also become thinner, thus resulting in thinning of the transparent conductive lines formed by the first transparent conductive layer.

In the display substrate according to this embodiment, at least one auxiliary trace is arranged on a side of the transparent conductive lines, so as to improve the amount of entering light in the exposure process and the etching amount during rge etching, thereby making an influence on the line widths of the transparent conductive line and improving the situation that the transparent conductive lines are in disconnection or thinned due to the reflection and focusing effects of the second conductive layer in the exposure process.

In some exemplary implementations, as shown in FIG. 2-FIG. 5, a first auxiliary trace 232 and a first transparent conductive line 231 of the first transparent conductive layer each extend along the second direction Y. The first auxiliary trace 232 is located on one side of the first transparent conductive line 231 in the first direction X, and the other side of the first transparent conductive line 231 is adjacent to another transparent conductive line. An orthographic projection of the first transparent conductive line 231 on the base substrate 10 is overlapped with an orthographic projection of a first via K11 on the base substrate 10. An orthographic projection of the first auxiliary trace 232 on the base substrate 10 in the first direction X is adjacent to an orthographic projection of the first via K11 on the base substrate 10. However, this embodiment is not limited thereto. For example, the orthographic projection of the first auxiliary trace 232 on the base substrate may be L-shaped in which one portion may extend along the second direction Y and the other portion may extend along the first direction X.

Figure 7:
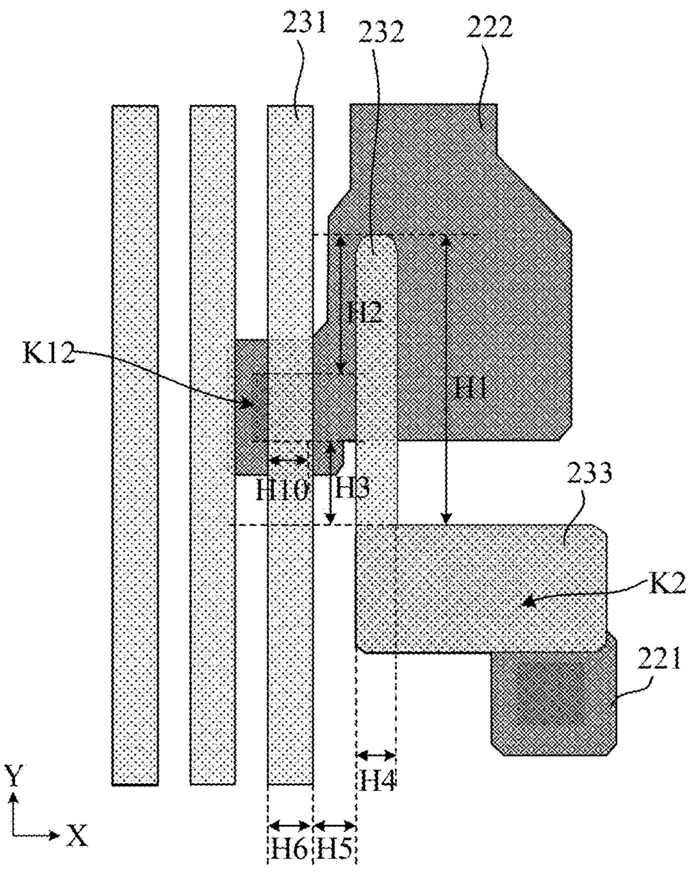
FIG. 7 is a partially enlarged view of a first transparent conductive line and a first auxiliary trace of a first transparent conductive layer of a display substrate according to at least one embodiment of the present disclosure.

FIG. 7 is a partially enlarged view of a first transparent conductive line and a first auxiliary trace of a first transparent conductive layer of a display substrate according to at least one embodiment of the present disclosure. In some exemplary implementations, as shown in FIG. 7, the first auxiliary trace 232 of the first transparent conductive layer is located on a side of the first transparent conductive line 231 along the first direction X. The first auxiliary trace 232 and a third anode connection electrode 233 may be in an integral structure. However, this embodiment is not limited thereto. For example, the first auxiliary trace 232 and the third anode connection electrode 233 may be independent from each other and the first auxiliary trace 232 may be electrically connected to another trace (e.g. a first power supply line or a second power supply line).

In some exemplary implementations, as shown in FIG. 7, the third anode connection electrode 233 may be a rectangle such as a rounded rectangle. For example, the first auxiliary trace 232 has a strip structure extending along the second direction Y. In the second direction Y, one end of the first auxiliary trace 232 is connected to the third anode connection electrode 233, and an orthographic projection of the other end of the first auxiliary trace 232 on the base substrate may be in an arc shape. In this example, by providing the orthographic projection of the end of the first auxiliary traces 232 on the base substrate to be in an arc shape, a problem of mask discharge in the preparation process may be improved, thereby improving the situation of thinning or even disconnection of the line widths.

In some exemplary implementations, as shown in FIG. 7, a line length (i.e., the length along the second direction Y) H1 of the first auxiliary trace 232 along the extension direction may be greater than an aperture of the first via K12 along the second direction Y. In the second direction Y, spacing H2 between the first auxiliary trace 232 and an edge of the first via K12 at a same side may be less than 5 microns, and spacing H3 between the first auxiliary trace 232 and another edge of the first via K12 same side may be less than 5 microns. An absolute value of a difference between a line width H4 of the first auxiliary trace 232 along an intersection direction (e.g. along the first direction X) of the extension direction and a line width H6 of the first transparent conductive line 231 along the intersection direction (e.g. along the first direction X) of the extension direction may be less than or equal to 0.3 microns. The first auxiliary trace 232 has a first spacing H5 between the first auxiliary trace 232 and the first transparent conductive line 231 in the first direction X, and an absolute value of a difference between the first spacing H5 and the line width H6 of the first transparent conductive line 231 along the first direction X may be less than or equal to 0.35 microns. For example, the length H1 of the first auxiliary trace 232 along the second direction Y may be about 13.5 microns to 16.5 microns, such as about 15 microns. The line width H4 of the first auxiliary trace 232 may be about 1.9 microns to 2.4 microns, such as about 2.2 microns. The first spacing H5 between the first auxiliary trace 232 and the first transparent conductive line 231 in the first direction X may be about 2.1 microns to 2.6 microns, such as about 2.35 microns. However, this embodiment is not limited thereto.

Figure 8:
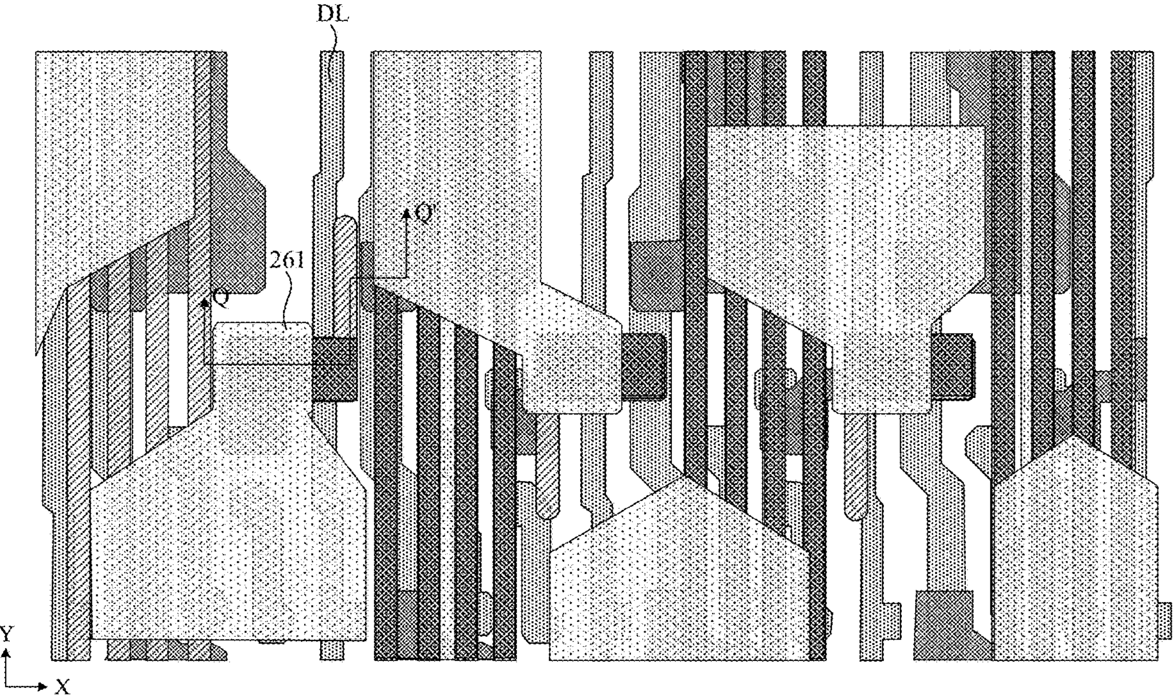
FIG. 8 is another partial top view of a display substrate according to at least one embodiment of the present disclosure.
Figure 9:
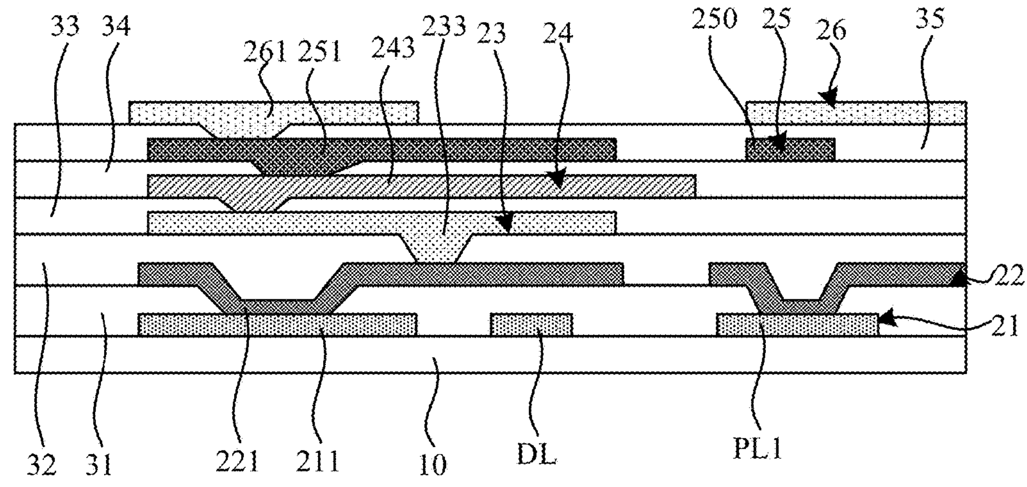
FIG. 9 is a partial cross-sectional view along Q-Q' direction in FIG. 8.
Figure 10:
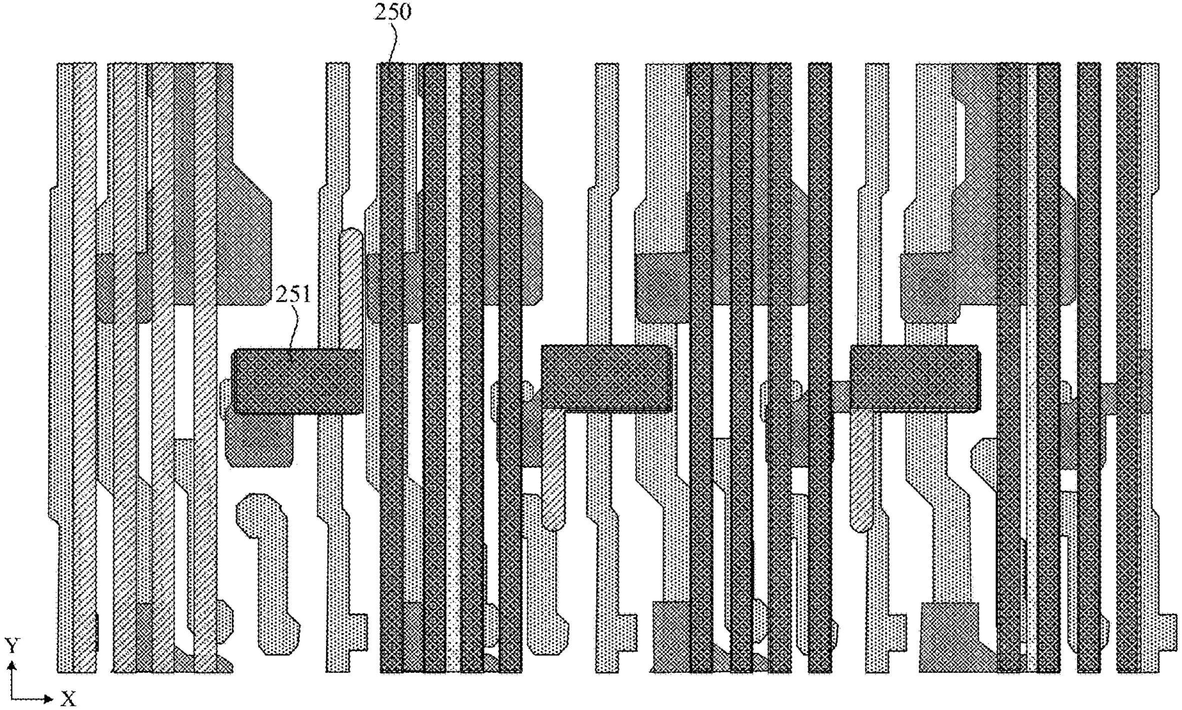
FIG. 10 is a partial top view of a display substrate after a third transparent conductive layer is formed in FIG. 8.
Figure 11:
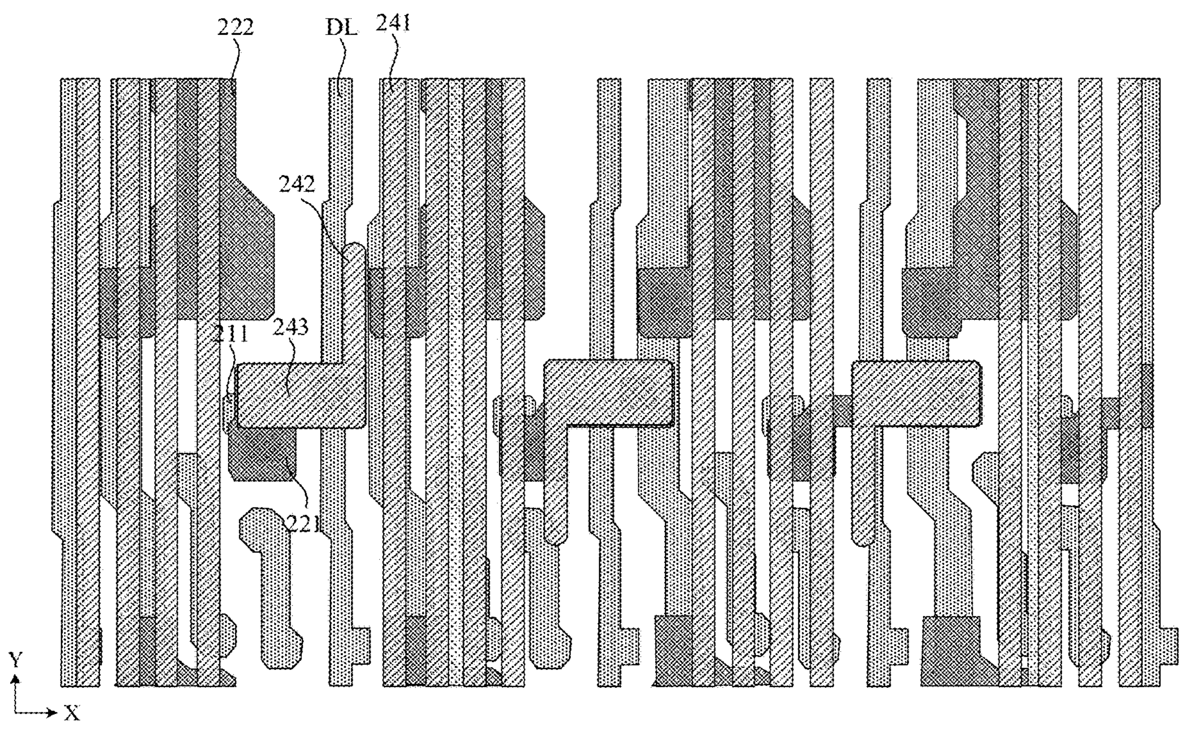
FIG. 11 is a partial top view of a display substrate after a second transparent conductive layer is formed in FIG. 8.
Figure 12:
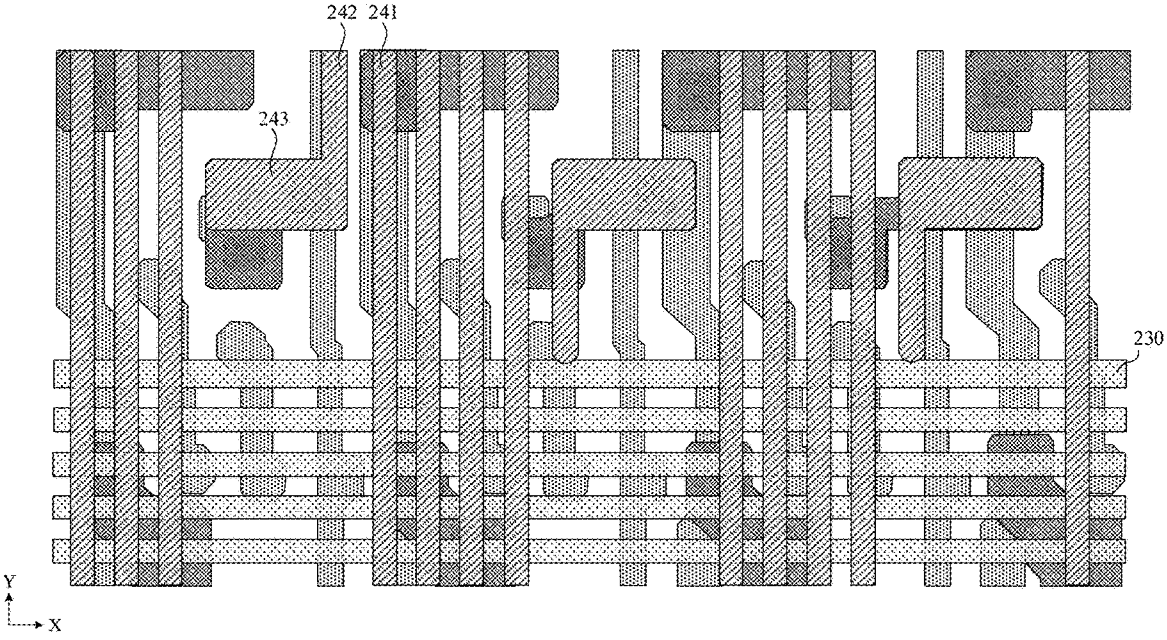
FIG. 12 is another schematic top view of a display substrate after a second transparent conductive layer is formed according to at least one embodiment of the present disclosure.

FIG. 8 is another partial top view of a display substrate according to at least one embodiment of the present disclosure. FIG. 8 may be another partial enlarged view of region S in FIG. 2. FIG. 9 is a partial cross-sectional view along a Q-Q' direction in FIG. 8. FIG. 10 is a partial top view of a display substrate after a third transparent conductive layer is formed in FIG. 8. FIG. 11 is a partial top view of a display substrate after a second transparent conductive layer is formed in FIG. 8. FIG. 12 is another schematic top view of a display substrate according to at least one embodiment of the present disclosure after a second transparent conductive layer is formed. A plurality of film layer structures on a side of the first conductive layer close to the base substrate are omitted in FIG. 8 to FIG. 12.

In some exemplary implementations, as shown in FIG. 8 and FIG. 9, in a direction perpendicular to the display substrate, the display substrate of the first display region A1 may include a base substrate 10, a first conductive layer 21, a first planarization layer 31, a second conductive layer 22, a second planarization layer 32, a first transparent conductive layer 23, a third planarization layer 33, a second transparent conductive layer 24, a fourth planarization layer 34, a third transparent conductive layer 25, a fifth planarization layer 35, and an anode layer 26 that are sequentially arranged on the base substrate 10. In some examples, the first planarization layer 31, the second planarization layer 32, the third planarization layer 33, the fourth planarization layer 34 and the fifth planarization layer 35 may be organic material layers. However, this embodiment is not limited thereto.

In some exemplary implementations, as shown in FIG. 8 to FIG. 12, the first conductive layer 21 may at least include a data line DL, a first power supply line PL1, and a plurality of connection electrodes (e.g., a first anode connection electrode 211). The second conductive layer 22 may at least include a shielding electrode 222 and a second anode connection electrode 221. The second anode connection electrode 221 is electrically connected to the first anode connection electrode 211 through a first via formed in the first planarization layer 31, and the shielding electrode 222 is electrically connected to the first power supply line PL1 through the first via formed in the first planarization layer 31. The first transparent conductive layer 23 at least includes a plurality of transparent conductive lines (e.g. a plurality of transparent conductive lines 230 extending along the first direction X shown in FIG. 12), a first auxiliary trace, and a third anode connection electrode 233. The third anode connection electrode 233 is electrically connected with the second anode connection electrode 221 through a second via formed in the second planarization layer 32. The second transparent conductive layer 24 at least includes a plurality of transparent conductive lines (e.g. a first transparent conductive line 241), a second auxiliary trace 242 and a fourth anode connection electrode 243. The fourth anode connection electrode 243 is electrically connected to the third anode connection electrode 233 through a third via formed in the third planarization layer 33. The third transparent conductive layer 25 at least includes a plurality of transparent conductive lines (e.g. a plurality of transparent conductive lines 250 extending along the second direction Y) and a fifth anode connection electrode 251. The fifth anode connection electrode 251 is electrically connected to the fourth anode connection electrode 243 through a fourth via formed in the fourth planarization layer 34. The anode layer 26 may include a plurality of anodes (e.g. an anode 261). The anode 261 may be electrically connected to the fifth anode connection electrode 251 through a fifth via formed in the fifth planarization layer 35. In this example, the second anode connection electrode of the second conductive layer 22 may be electrically connected to the anode though anode connection electrodes arranged in sequence in three transparent conductive layers (i.e., including the third anode connection electrode in the first transparent conductive layer, the fourth anode connection electrode of the second transparent conductive layer, and the fifth anode connection electrode of the third transparent conductive layer). However, this embodiment is not limited thereto. For example, the second anode connection electrode of the second conductive layer 22 may be electrically connected to the anode through the third anode connection electrode of the first transparent conductive layer, the fourth anode connection electrode of the second transparent conductive layer, or the fifth anode connection electrode of the third transparent conductive layer.

In some exemplary implementations, as shown in FIG. 11 and FIG. 12, an orthographic projection of the second transparent conductive line 241 of the second transparent conductive layer on the base substrate 10 is overlapped with an orthographic projection of the first via on the base substrate 10. A second auxiliary trace 242 is arranged on a side of the first transparent conductive line 241, and the second auxiliary trace 242 and the first transparent conductive line 241 extend in a same direction, for example, they both extend along the second direction Y. An orthographic projection of the second auxiliary trace 242 on the base substrate 10 is adjacent to an orthographic projection of the first via on the base substrate 10 in the first direction X. An orthographic projection of an end of the second auxiliary trace 242 in the second direction Y on the base substrate 10 is in a circular arc shape. Structures of the first transparent conductive line and the second auxiliary trace of the second transparent conductive layer may be schematically described with reference to the structures of the first transparent conductive line and the first auxiliary trace of the first transparent conductive layer of the above-described embodiment, which will not be repeated here. In this example, in the first transparent conductive layer, a first auxiliary trace may also be arranged at a periphery of the first transparent conductive line overlapped with the first via, and in the third transparent conductive layer, a third auxiliary trace may be arranged at the periphery of the first transparent conductive line overlapped with the first via. For example, the third auxiliary trace may also be arranged in third transparent conductive layer, and the third auxiliary trace and the fifth anode connection electrode may be in an integral structure.

The first auxiliary trace may also be arranged in first transparent conductive layer, and the first auxiliary trace and the third anode connection electrode may be in an integral structure. However, this embodiment is not limited thereto. In some examples, the second auxiliary trace and the fourth anode connection electrode of the second transparent conductive layer may be independent from each other, the first auxiliary trace and the third anode connection electrode of the first transparent conductive layer may be independent from each other, and the third auxiliary trace and the fifth anode connection electrode of the third transparent conductive layer may be independent from each other.

Rest of the structures of the display substrate according to the embodiment may be referred to descriptions of the aforementioned embodiments, and will not be repeated here.

Figure 13:
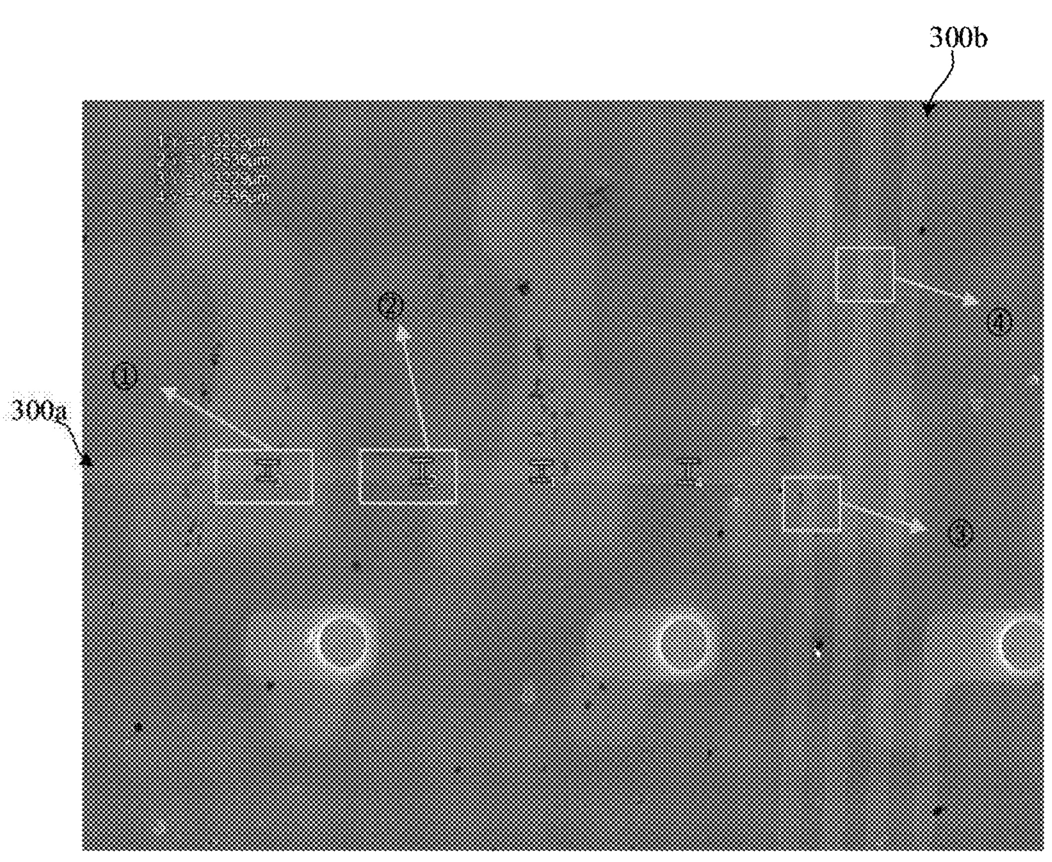
FIG. 13 is a partial top view of a display substrate.

FIG. 13 is a partial top view of a display substrate. As shown in FIG. 13, a transparent conductive layer (e.g. a first transparent conductive layer, a second transparent conductive layer or a third transparent conductive layer) may include a single transparent conductive line 300*a* and a plurality of adjacent transparent conductive lines 300*b*. The plurality of transparent conductive lines 300*b* are sequentially arranged adjacent to each other, and their orthographic projections on the base substrate are each overlapped with an orthographic projection of the second conductive layer on the base substrate. There is a situation that a line width of the transparent conductive line 300*b* is thinned, and as shown in the regions ③ and ④ marked in FIG. 13, line widths of the transparent conductive lines 300*b* in the regions ③ and ④ are smaller than the line widths where the transparent conductive lines 300*b* are not overlapped with the second conductive layer. There is a situation that the line width of the single transparent conductive line 300*a* is thinned, and as shown in regions ① and ② marked in FIG. 13, the line width of the transparent conductive line 300*a* in the region ② is larger than that in the region ①. Due to the reflection and focusing effects of the second conductive layer in the exposure process, the photoresist thin film above the second conductive layer will become thinner, thus resulting in that the transparent conductive lines will become thinner.

Figure 14:
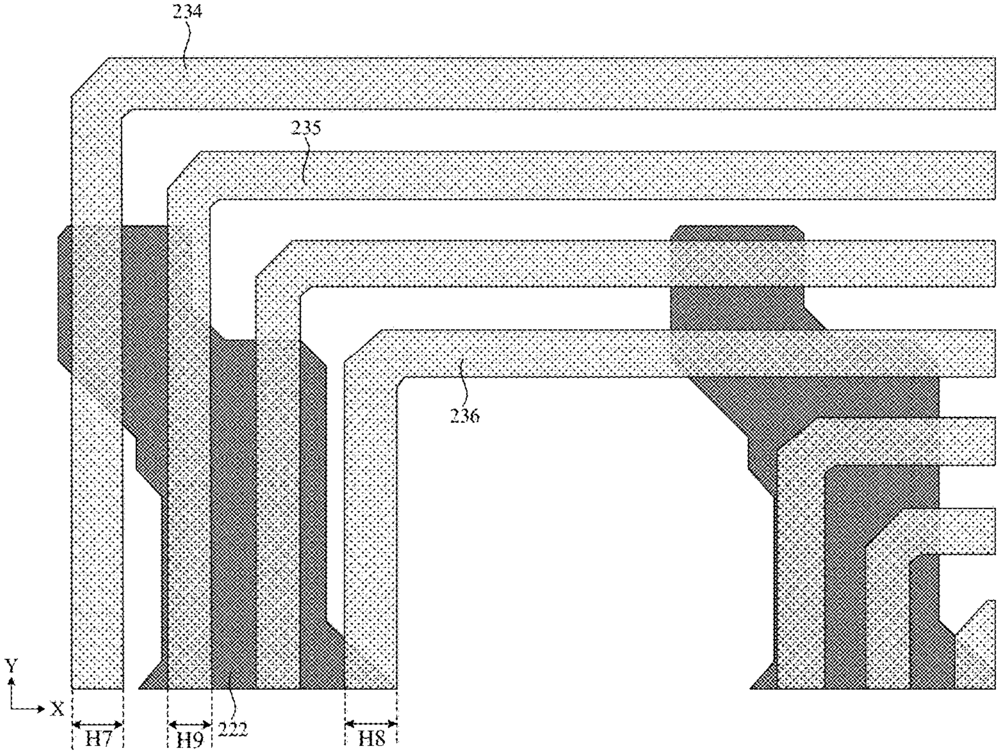
FIG. 14 is another partial top view of a display substrate according to at least one embodiment of the present disclosure.

FIG. 14 is another partial top view of a display substrate according to at least one embodiment of the present disclosure. FIG. 14 illustrates a second conductive layer and a first transparent conductive layer as examples. In some exemplary implementations, as shown in FIG. 14, the first transparent conductive layer may include a plurality of second transparent conductive lines (e.g. marginal transparent conductive lines 234 and 236, a non-marginal transparent conductive line 235). The plurality of second transparent conductive lines are arranged adjacent to each other, and have an orthographic projection on the base substrate which is overlapped with an orthographic projection of the shielding electrode 222 of the second conductive layer on the base substrate. There is no adjacent transparent conductive line on the left side of the marginal transparent conductive lines 234, there is no adjacent transparent conductive line on the right side of at least portion of the marginal transparent conductive line 236, and two non-marginal transparent conductive lines 235 are located between the marginal transparent conductive lines 234 and 236. In some examples, the line width of the marginal transparent conductive lines 234 and 236 along an intersection direction of the extension direction may be substantially the same and may be greater than the line width of the non-marginal transparent conductive lines 235 along the intersection direction of the extension direction. An absolute value of a difference between the line width of a marginal transparent conductive line (e.g. marginal transparent conductive line 234 or 236) and the line width of the non-marginal transparent conductive line 235 may be 0.3 microns to 0.5 microns. For example, the line width H7 of the marginal transparent conductive line 234 along the intersection direction of the extension direction may be about 2.0 microns to 2.5 microns, for example, may be about 2.3 microns, the line width H8 of the marginal transparent conductive line 236 along the intersection direction of the extension direction may be about 2.0 microns to 2.5 microns, for example, may be about 2.3 microns, and the line width H9 of the non-marginal transparent conductive line 235 along the intersection direction of the extension direction may be about 1.8 microns to 2.2 microns, for example, may be about 2.0 microns. No other transparent conductive lines are arranged within a range which has a distance greater than or equal to 5 microns from the right side of the marginal transparent conductive line 236. After the marginal transparent conductive line 236 extends along the first direction X, adjacent transparent conductive lines exist in the second direction Y, and a line width of a marginal transparent conductive line 236 having an adjacent transparent conductive line may be approximately the same as that of the non-marginal transparent conductive line 235. In other words, the marginal transparent conductive line 236 may include a first portion with no adjacent transparent conductive line within a peripheral range of 5 micron and a second portion with an adjacent transparent conductive line within a peripheral range of 5 micron, and a line width of the first portion may be greater than that of the second portion. In this example, by compensating the line width of a transparent conductive line at one side edge without an adjacent transparent conductive line around it, it is possible to ensure that there is no risk of short circuit between adjacent transparent conductive lines and improve the thinning of the line widths of the transparent conductive lines. However, this embodiment is not limited thereto. In some other examples, the second transparent conductive layer and the third transparent conductive layer may also include a plurality of second transparent conductive lines, and among the plurality of second transparent conductive lines, a line width of a marginal transparent conductive line may be greater than a line width of a non-marginal transparent conductive line.

In some exemplary implementations, the first transparent conductive layer may further include a single third transparent conductive line (e.g. transparent conductive line 300*a* in FIG. 13). An orthographic projection of the third transparent conductive line 300*a* on the base substrate is overlapped with an orthographic projection of the second conductive layer on the base substrate. In a plane parallel to the display substrate, no other transparent conductive line is arranged within a range of 4 microns around the third transparent conductive line 300*a*. A line width of the third transparent conductive line 300*a* along the intersection direction of the extension direction may be larger than a line width of the marginal transparent conductive lines (e.g. the marginal transparent conductive lines 234 and 236 in FIG. 14) along the intersection direction of the extension direction. For example, the line width of the third transparent conductive line 300*a* may be about 2.3 microns to 2.8 microns, for example, may be about 2.6 microns. In this example, by compensating the line width of the third transparent conductive line, the exposure environment of the first transparent conductive layer may be improved, thereby improving the situation that the line widths of the transparent conductive lines become thinner. However, this embodiment is not limited thereto. In some other examples, the second transparent conductive layer and the third transparent conductive layer may also include a third transparent conductive line, and the line width of the third transparent conductive line may be greater than a line width of a marginal transparent conductive line of the plurality of second transparent conductive lines.

Figure 15:
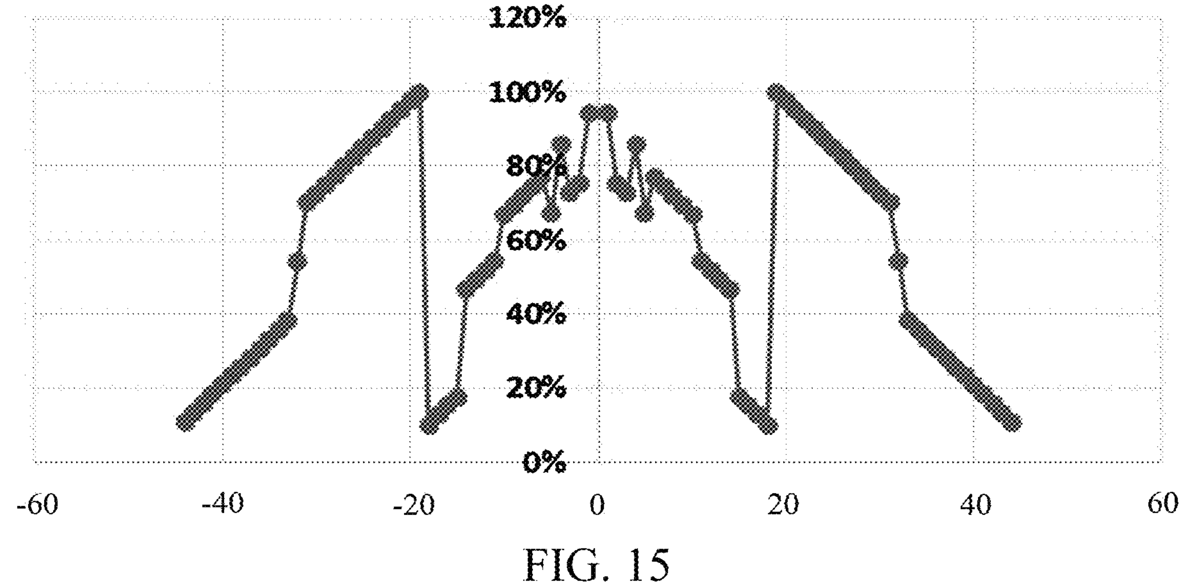
FIG. 15 is a schematic diagram of a capacitance of a transparent conductive layer of a display substrate.

FIG. 15 is a schematic diagram of a capacitance of a transparent conductive layer of a display substrate. As shown in FIG. 15, the abscissa indicates a position of a second display region A2 of the display substrate in the first direction, and the ordinate indicates a ratio of a capacitance of a transparent conductive line connected to a light emitting element at this position to a total capacitance. A second light emitting element of the second display region A2 is electrically connected with a second pixel circuit of the first display region A1 through a transparent conductive line, and the capacitance of the transparent conductive line affects the display effect of the second light emitting element. Under a high gray scale, a large capacitance of the transparent conductive line will lead to a decrease of light-emitting duration and too low brightness. Under a low gray scale, a large capacitance will cause the second light emitting element to fail to illuminate and the brightness will be too low. It can be seen that the capacitance of transparent conductive lines has a great influence on the poor display of the display substrate, and the greater differences between the capacitances, the more obvious the phenomenon of poor display. The display substrate according to this embodiment reduces capacitance differences between different transparent conductive lines by configuring the line lengths and line widths of the transparent conductive lines, so as to improve the display effect.

In some exemplary implementations, the transparent conductive layer of the display substrate of this embodiment may include at least one fourth transparent conductive line and at least one fifth transparent conductive line. For example, at least one of the first transparent conductive layer, the second transparent conductive layer, and the third transparent conductive layer may include a fourth transparent conductive line and a fifth transparent conductive line. A line length of the fourth transparent conductive line along the extension direction is larger than a line length of the fifth transparent conductive line along the extension direction, and a line width of the fourth transparent conductive line along an intersection direction of the extension direction is smaller than a line width of the fifth transparent conductive line along the intersection direction of the extension direction. In this example, a line width of a transparent conductive line with a larger line length is configured to be smaller, and a line width of a transparent conductive line with a smaller line length is configured to be larger, so as to minimize the capacitance differences between different transparent conductive lines.

In some exemplary implementations, an orthographic projection of the fourth transparent conductive line on the base substrate is overlapped with an orthographic projection of a first number of first vias on the base substrate, and an orthographic projection of the fifth transparent conductive line on the base substrate is overlapped with an orthographic projection of a second number of first vias on the base substrate, wherein the first number is greater than the second number. In this example, the fourth transparent conductive line is arranged to be overlapped with more first vias, thereby increasing the influence of the reflection and focusing effects of the second conductive layer in the exposure process on the line width of the fourth transparent conductive line, so as to reduce the line width of the fourth transparent conductive line.

In some exemplary implementations, an overlapping area between the orthographic projection of the fourth transparent conductive line on the base substrate and an orthographic projection of the second conductive layer on the base substrate is greater than an overlapping area between the orthographic projection of the fifth transparent conductive line on the base substrate and the orthographic projection of the second conductive layer on the base substrate. In this example, by configuring the overlapping area between the fourth transparent conductive line and the second conductive layer to be larger than the overlapping area between the fifth transparent conductive line and the second conductive layer, the influence of the reflection and focusing effects of the second conductive layer in the exposure process on the line width of the fourth transparent conductive line may be increased to reduce the line width of the fourth transparent conductive line.

Figure 16:
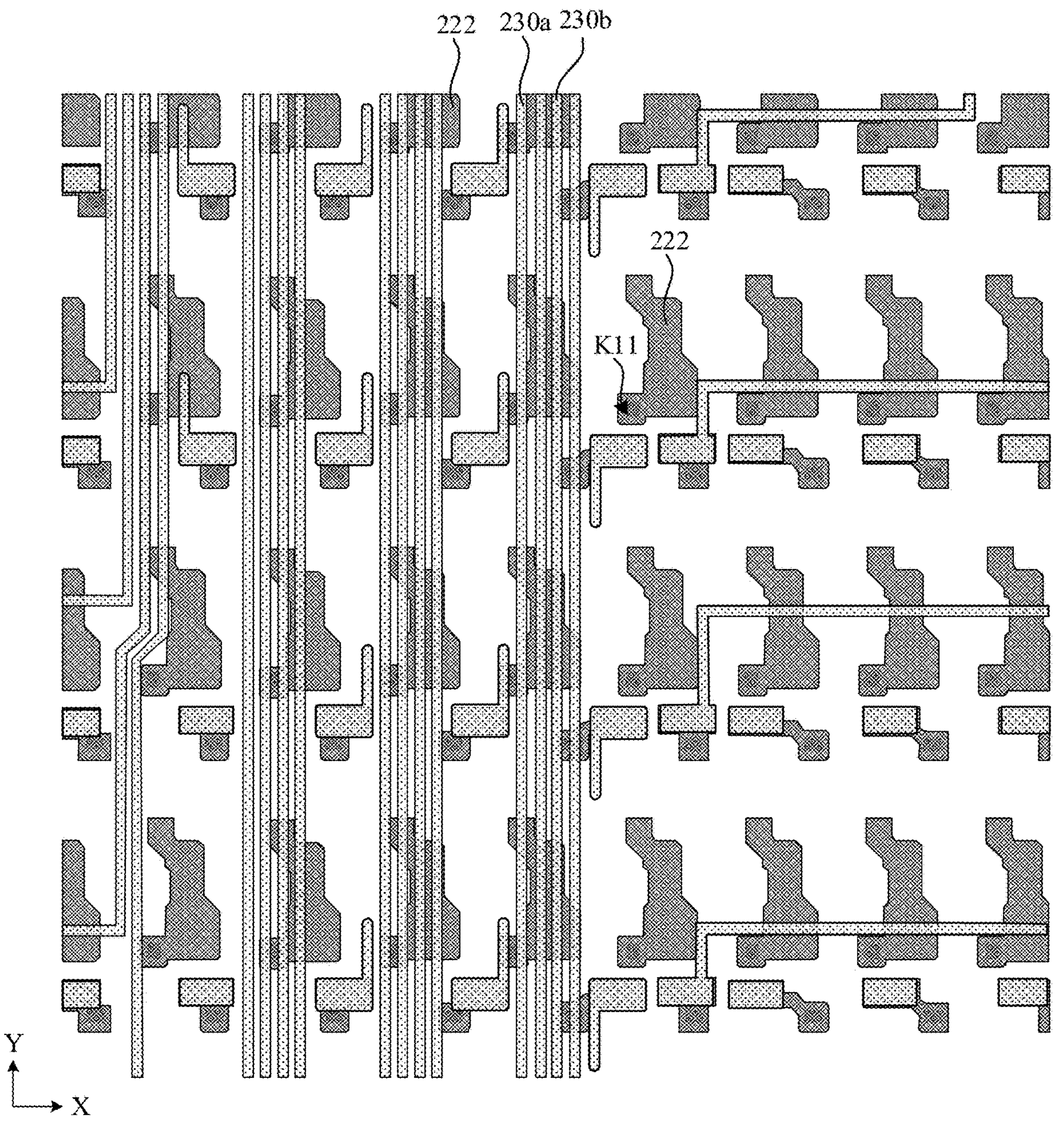
FIG. 16 is another partial top view of a display substrate according to at least one embodiment of the present disclosure.

FIG. 16 is another partial top view of a display substrate according to at least one embodiment of the present disclosure. FIG. 16 illustrates a second conductive layer and a first transparent conductive layer as an example. In some exemplary implementations, as shown in FIG. 16, the second conductive layer is electrically connected to the first conductive layer through a first via formed in the first planarization layer. For example, the shielding electrode 222 of the second conductive layer may be electrically connected to the first conductive layer through a first via K11 formed in the first planarization layer. The first transparent conductive layer includes at least a plurality of transparent conductive lines (e.g. a fourth transparent conductive line 230*a* and a fifth transparent conductive line 230*b*). An orthographic projection of the fourth transparent conductive line 230*a* on the base substrate is overlapped with an orthographic projection of a first number of first vias on the base substrate, and an orthographic projection of the fifth transparent conductive line 230*b* on the base substrate is overlapped with an orthographic projection of a second number of first vias on the base substrate. For example, the first number is greater than the second number. That is, the number of the first vias overlapped with the fourth transparent conductive line 230*a* is larger than the number of the first vias overlapped with the fifth transparent conductive line 230*b*. However, this embodiment is not limited thereto. For example, the second transparent conductive layer and the third transparent conductive layer may also include a fourth transparent conductive line and a fifth transparent conductive line.

In some exemplary implementations, a ratio of a length of an overlapping region in the intersection direction (for example, the first direction X) of the extension direction to a line width of the transparent conductive lines may be greater than or equal to 0.5, wherein the overlapping region is a region where an orthographic projection of any one of the fourth and fifth transparent conductive lines on the base substrate is overlapped with an orthographic projection of the first vias on the base substrate. In some examples, as shown in FIG. 7, the ratio of the length H10 of an overlapping region in the first direction X to the line width H6 of a transparent conductive line may be greater than or equal to 0.5 (e.g. may be about 0.6 or 0.7), wherein the overlapping region is a region where an orthographic projection of the transparent conductive line (e.g. the first transparent conductive line 231) of the first transparent conductive layer on the base substrate is overlapped with an orthographic projection of a first via K12 on the base substrate. In this example, the ratio of the length of the overlapping region between the transparent conductive line and the first via along the first direction X to the line width of the transparent conductive line may be greater than or equal to 0.5, and the line width of the transparent conductive line overlapping with the first via may be affected by the reflection and focusing effects of the second conductive layer during the preparation of the transparent conductive layer, such as reducing the line width of the transparent conductive line overlapped with the first via. In this way, the capacitance differences between different transparent conductive lines may be ensured to be reduced without other defects, so as to improve the display effect.

Figure 17:
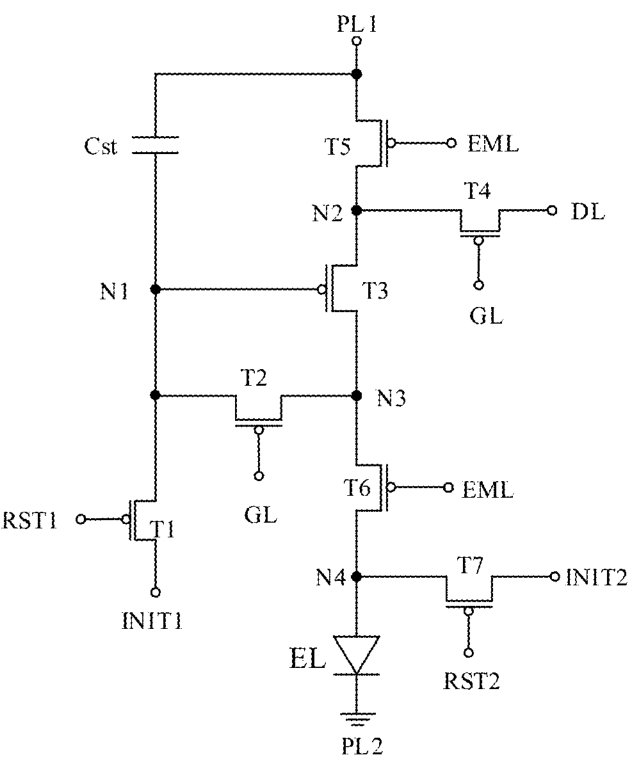
FIG. 17 is an equivalent circuit diagram of a pixel circuit according to at least one embodiment of the present disclosure.
Figure 18:
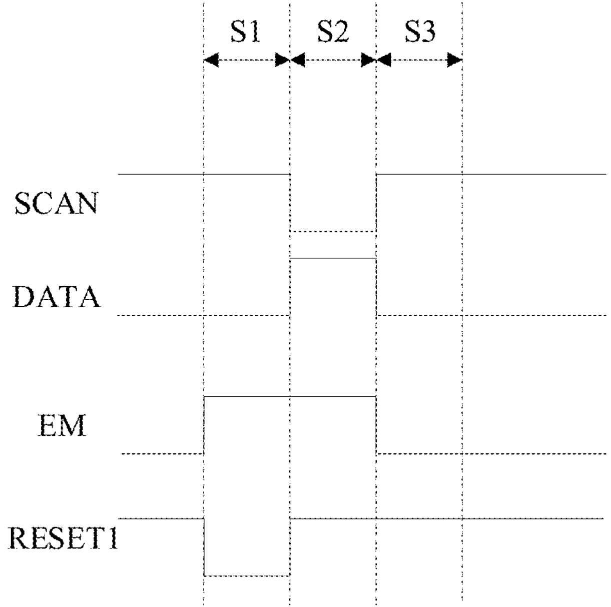
FIG. 18 is an operating sequence diagram of a pixel circuit according to at least one embodiment of the present disclosure.

FIG. 17 is an equivalent circuit diagram of a pixel circuit according to at least one embodiment of the present disclosure. FIG. 18 is an operating sequence diagram of a pixel circuit according to at least one embodiment of the present disclosure. The pixel circuit of this exemplary embodiment is a 7T1C structure. However, this embodiment is not limited thereto. For example, the pixel circuit may have a structure of 3T1C, 5T1C, 8T1C, or 8T2C, etc.

In some exemplary implementations, as shown in FIG. 17, the pixel circuit of this example includes six switching transistors (T1, T2, and T4 to T7), one drive transistor T3, and one storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. A light emitting element EL includes an anode, a cathode and an organic light emitting layer arranged between the anode and the cathode.

In some exemplary implementations, the drive transistor and the six switching transistors may be P-type transistors or may be N-type transistors. Use of a same type of transistors in the pixel circuit may simplify a process flow, reduce a process difficulty of a display substrate, and improve a yield of products. In some exemplary implementations, the drive transistor and the six switching transistors may include a P-type transistor and an N-type transistor.

In some exemplary implementations, Low Temperature Poly Silicon thin film transistors, or oxide thin film transistors, or a Low Temperature Poly Silicon thin film transistor and an oxide thin film transistor may be used for the drive transistor and the six switching transistors. An active layer of a Low Temperature Poly Silicon thin film transistor is made of Low Temperature Poly Silicon (LTPS), and an active layer of an oxide thin film transistor is made of an oxide semiconductor (Oxide). A Low-temperature Poly Silicon thin film transistor has advantages such as a high mobility rate and fast charging, while an oxide thin film transistor has an advantage such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low-frequency drive, reduce power consumption, and improve display quality.

In some exemplary implementations, as shown in FIG. 17, the display substrate includes a scan line GL, a data line DL, a first power supply line PL1, a second power supply line PL2, an emitting control line EML, a first initial signal line INIT1, a second initial signal line INIT2, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, wherein the first voltage signal VDD is greater than the second voltage signal VSS. The scan line GL is configured to provide a scan signal SCAN to the pixel circuit, the data line DL is configured to provide a data signal DATA to the pixel circuit, the light emitting control line EML is configured to provide a light emitting control signal EM to the pixel circuit, the first reset control line RST1 is configured to provide a first reset control signal RESET1 to the pixel circuit, and the second reset control line RST2 is configured to provide a second reset control signal RESET2 to the pixel circuit. In some examples, in a pixel circuit of an n-th row, a first reset control line RST1 may be electrically connected with a scan line GL of a pixel circuit of an (n−1)-th row to be inputted with a scan signal SCAN(n−1), that is, a first reset control signal RESET1(*n*) is the same as the scan signal SCAN(n−1). A second reset control line RST2 may be electrically connected with a scan line GL of the pixel circuit of the n-th row to be inputted with a scan signal SCAN(n), that is, a second reset control signal RESET2(*n*) is the same as the scan signal SCAN(n). In some examples, the second reset control line RST2 with which the pixel circuit of the n-th row is electrically connected and a first reset control line RST1 with which the pixel circuit of the (n+1)-th row is electrically connected are in an integral structure. Thus, signal lines of the display substrate may be reduced, and a narrow bezel of the display substrate may be achieved. However, this embodiment is not limited thereto.

In some exemplary implementations, the first initial signal line INIT1 is configured to provide a first initial signal to the pixel circuit, the second initial signal line INIT2 is configured to provide a second initial signal to the pixel circuit. For example, the first initial signal and the second initial signal may be constant voltage signals, and their magnitudes may be between a first voltage signal VDD and a second voltage signal VSS, but not limited to this.

In some exemplary implementations, as shown in FIG. 17, the drive transistor T3 is electrically connected with the light emitting element EL, and outputs a drive current to drive the light emitting element EL to emit light under control of the scan signal SCAN, the data signal DATA, the first voltage signal VDD, the second voltage signal VSS, and other signals. A gate of the data writing transistor T4 is electrically connected with the scan line GL, a first electrode of the data writing transistor T4 is electrically connected with the data line DL, and a second electrode of the data writing transistor T4 is electrically connected with a first electrode of the drive transistor T3. A gate of the threshold compensation transistor T2 is electrically connected with the scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of the first light emitting control transistor T5 is electrically connected with the light emitting control line EML, a first electrode of the first light emitting control transistor T5 is electrically connected with the first power supply line PL1, and a second electrode of the first light emitting control transistor T5 is electrically connected with the first electrode of the drive transistor T3. A gate of the second light emitting control transistor T6 is electrically connected with the light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. The first reset transistor T1 is electrically connected with the gate of the drive transistor T3 and configured to reset the gate of the drive transistor T3, and the second reset transistor T7 is electrically connected with the anode of the light emitting element EL and configured to reset the anode of the light emitting element EL. A gate of the first reset transistor T1 is electrically connected with the first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with the second reset control line RST2, a first electrode of the second reset transistor T7 is electrically connected with the second initial signal line INIT2, and a second electrode of the second reset transistor T7 is electrically connected with the anode of the light emitting element EL. A first electrode of a storage capacitor Cst is electrically connected with the gate of the drive transistor T3, and a second electrode of the storage capacitor Cst is electrically connected with the first power supply line PL1.

In this example, a first node N1 is a connection point between the storage capacitor Cst, the first reset transistor T1, the drive transistor T3, and the threshold compensation transistor T2. A second node N2 is a connection point between the first light emitting control transistor T5, the data writing transistor T4, and the drive transistor T3. A third node N3 is a connection point between the drive transistor T3, the threshold compensation transistor T2, and the second light emitting control transistor T6. A fourth node N4 is a connection point between the second light emitting control transistor T6, the second reset transistor T7, and the light emitting element EL.

An operating process of the pixel circuit illustrated in FIG. 17 will be described below with reference to FIG. 18. Description is given by taking a case in which multiple transistors included in the pixel circuit shown in FIG. 17 are all P-type transistors as an example.

In some exemplary implementations, as shown in FIG. 18, during one frame of display period, an operating process of a pixel circuit with a first structure includes: a first stage S1, a second stage S2, and a third stage S3.

The first stage S1 is referred to as a reset stage. In this stage, a first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage S2 is referred to as a data writing stage or a threshold compensation stage. In this stage, the scan signal SCAN provided by the scan line GL is a low-level signal, the first reset control signal RESET1 provided by the first reset control line RST1 and the light emitting control signal EM provided by the light emitting control line EML are both high-level signals, and the data line DL outputs a data signal DATA. In this stage, the second electrode of the storage capacitor Cst is at a low level, so that the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the second electrode (that is, the first node N1) of the storage capacitor Cst is Vdata−|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

The third stage S3 is referred to as a light emitting stage. In this stage, the light emitting control signal EM provided by the light emitting control signal line EML is a low-level signal, and the scan signal SCAN provided by the scan line GL and the first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Since the voltage of the first node N1 is Vdata−|Vth|, the drive current of the drive transistor T3 is as follows.

$$I=K\times(Vgs-Vth)^2=K\times[(VDD-V\text{data}+|Vth|)-Vth]^2=K\times[VDD-V\text{data}]^2$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3.

Therefore, the pixel circuit of this embodiment may better compensate the threshold voltage of the drive transistor T3.

Figure 19:
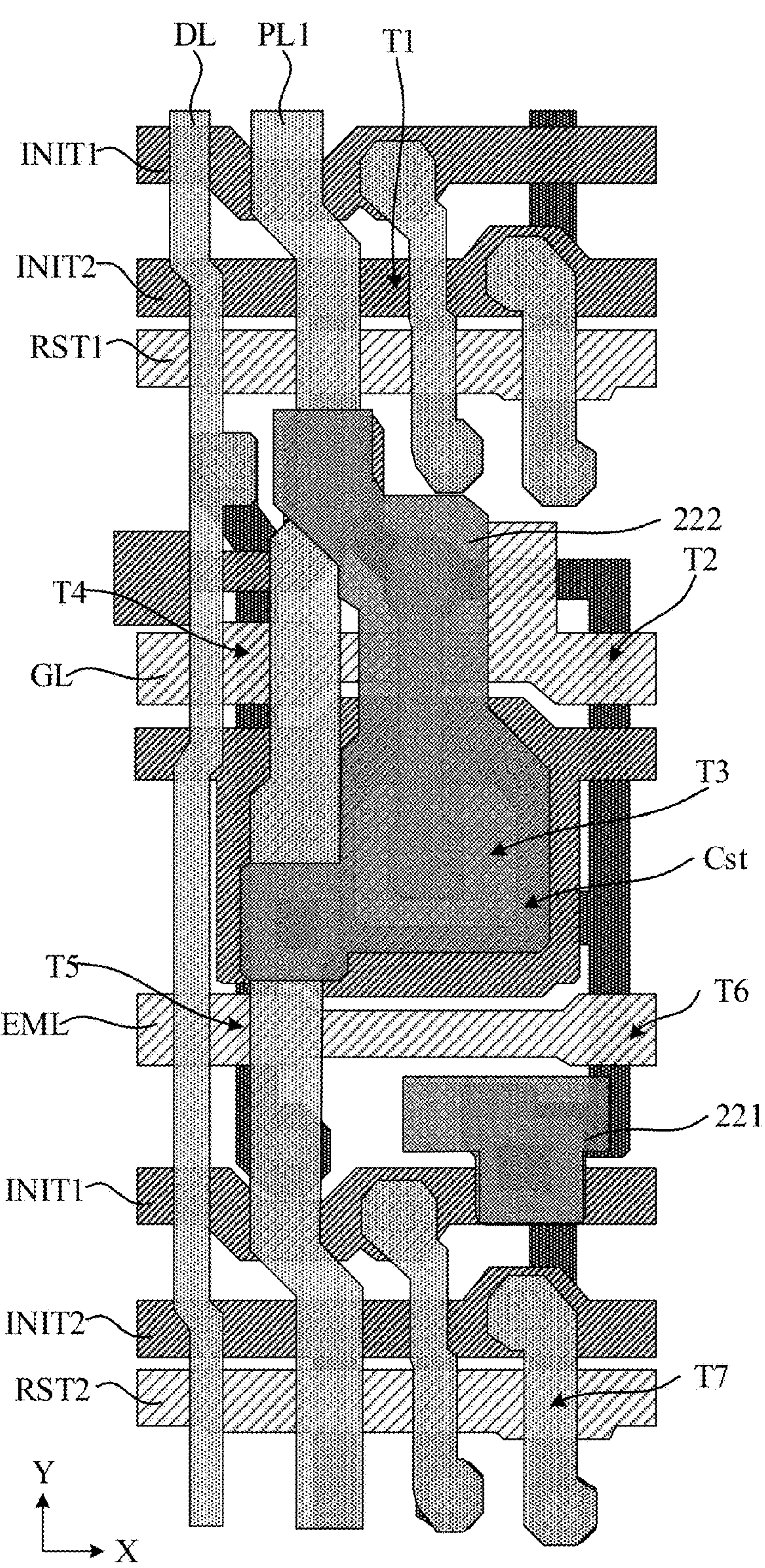
FIG. 19 is a schematic top view of a pixel circuit according to at least one embodiment of the present disclosure.

FIG. 19 is a schematic top view of a pixel circuit according to at least one embodiment of the present disclosure. In some exemplary implementations, as shown in FIG. 19, the display substrate of the first display region may include a base substrate, and a semiconductor layer, a first insulation layer, a first gate metal layer, a second insulation layer, a second gate metal layer, a third insulation layer, a first source-drain metal layer, a fourth insulation layer, and a second source-drain metal layer which are sequentially arranged on the base substrate. In some examples, the first insulation layer, the second insulation layer and the third insulation layer may be inorganic insulation layers, and the second insulation layer may be an organic insulation layer. However, this embodiment is not limited thereto. In this example, the first source-drain metal layer is the first conductive layer in the aforementioned embodiments, and the second source-drain metal layer is the second conductive layer in the aforementioned embodiments. A film layer structure of the first conductive layer of the first display region a side close to the base substrate in the aforementioned embodiment may be shown with reference to FIG. 19.

In some exemplary implementations, as shown in FIG. 19, the semiconductor layer may include an active layer of a plurality of transistors of a pixel circuit (e.g. an active layer of a first transistor T1 to an active layer of a seventh transistor T7). The first gate metal layer may include gates of a plurality of transistors of the pixel circuit, a first plate of a storage capacitor, a first reset control line RST1, a second reset control line RST2, a scan line GL, and a light emitting control line EML. The second gate metal layer may include a second plate of the storage capacitor of the pixel circuit, a first initial signal line INIT1, and a second initial signal line INIT2. The first source-drain metal layer may include a data line DL, a first power supply line PL1 and a plurality of connection electrodes (e.g. a first anode connection electrode). The first anode connection electrode may be electrically connected to the second light emitting control transistor T6 and the second reset transistor T7. The second source-drain metal layer may include a shielding electrode 222 and a second anode connection electrode 221. The shielding electrode 222 may be electrically connected to the first power supply line PL1. The second anode connection electrode 221 may be electrically connected with the first anode connection electrode. In this example, the shielding electrode 222 may be in an irregular shape to be configured to cover the first node N1 to reduce crosstalk of the transparent conductive layer to the first node N1.

Figure 20:
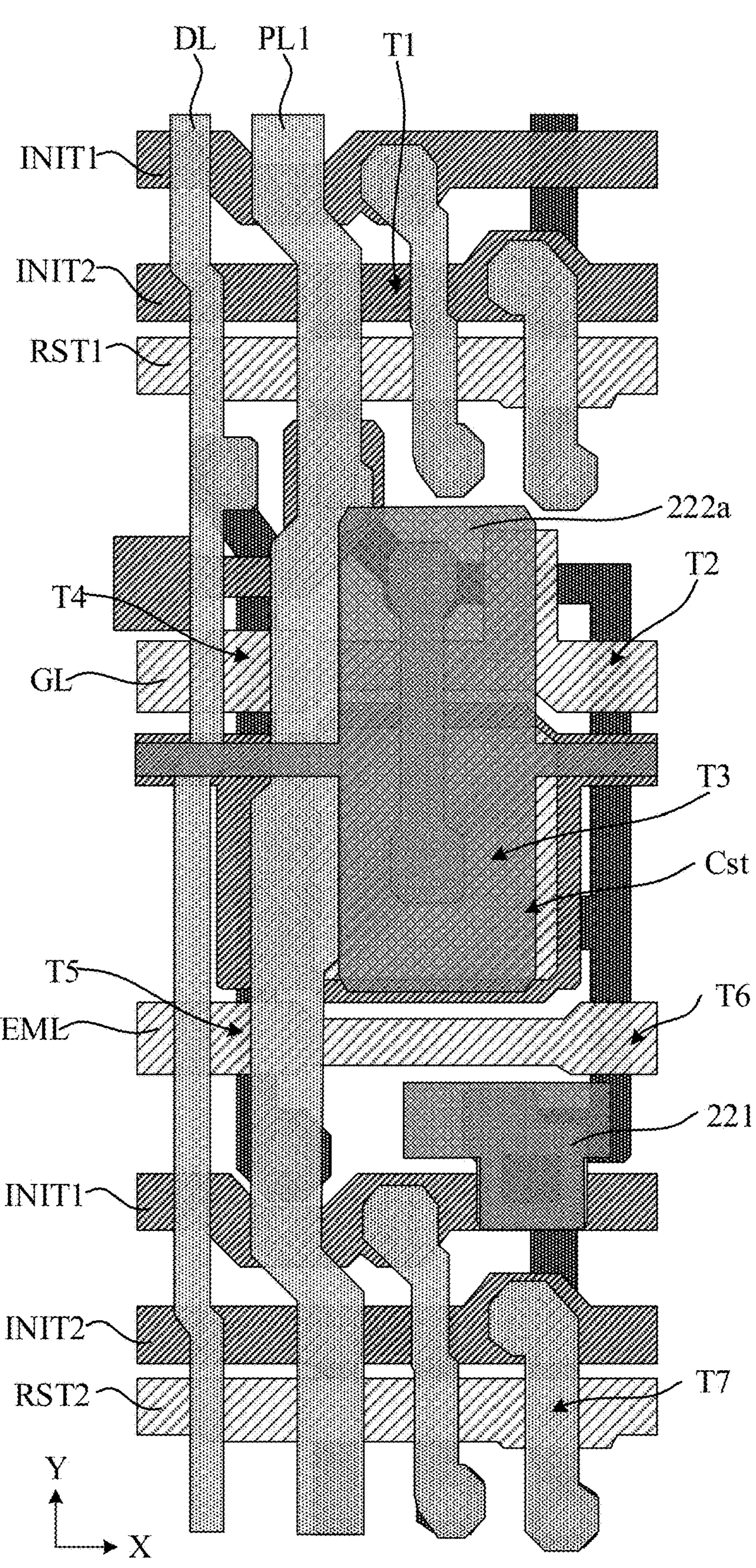
FIG. 20 is another schematic top view of a pixel circuit according to at least one embodiment of the present disclosure.

FIG. 20 is another schematic top view of a pixel circuit according to at least one embodiment of the present disclosure. In some exemplary implementations, as shown in FIG. 20, the shielding electrode 222*a* of the second conductive layer may be in a regular shape, for example may have a shape of a rectangle or a rounded rectangle. Shielding electrodes 222*a* of adjacent pixel circuits may be in an integral structure. The shielding electrode 222*a* may be electrically connected to the first power supply line PL1 in a peripheral region. However, this embodiment is not limited thereto. For example, the shielding electrode may have a regular shape such as a circle or a pentagonal or hexagonal shape. The rest of structures of the pixel circuit according to this embodiment may be referred to descriptions of the aforementioned embodiments, and thus will not be repeated here.

In some exemplary implementations, during low gray-scale display, a capacitance of the fourth node N4 is larger due to a longer length of the transparent conductive line to which the pixel circuit is connected, resulting in a longer time for lighting up the second light emitting element, while overlapping areas between different transparent conductive lines and the second conductive layer are different, which may affect the line widths of the transparent conductive lines, resulting in capacitance differences between different transparent conductive lines, and thus causing poor display. In this exemplary embodiment, by providing the shielding electrodes with regular shapes, the line widths of the transparent conductive lines of the transparent conductive layer may be kept consistent, thereby reducing the capacitance differences between the transparent conductive lines of adjacent pixel circuits, thereby improving the low gray-scale display effect.

The structure of the display substrate will be described below through an example of a manufacturing process of the display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. The deposition may be any one or more of sputtering, evaporation, and chemical vapor deposition. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate using deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary implementations, a manufacturing process of the display substrate may include following operations.

(1) A base substrate is provided.

In some exemplary implementations, the base substrate may be a rigid substrate, e.g., a glass substrate. However, this embodiment is not limited thereto. For example, the base substrate may be a flexible substrate.

(2) A semiconductor layer is formed.

In some exemplary implementations, a semiconductor thin film is deposited on the base substrate in the first display region, and the semiconductor thin film is patterned by a patterning process to form a semiconductor layer. In some examples, a material of the semiconductor thin film may be polysilicon.

(3) A first gate metal layer is formed.

In some exemplary implementation, a first insulation thin film and a first metal thin film are sequentially deposited on the base substrate where the aforementioned structure is formed, and the first metal thin film is patterned through a patterning process to form a first insulation layer covering the semiconductor layer, and the first gate metal layer arranged on the first insulation layer in the first display region.

In some exemplary implementations, after a pattern of the first gate metal layer is formed, the first gate metal layer may be used as a shield to perform a conductive treatment on the semiconductor layer. The semiconductor layer in a region shielded by the first gate metal layer forms channel regions of a plurality of transistors, and the semiconductor layer in a region not shielded by the first gate metal layer is made to be conductive, that is, the first doped regions and the second doped regions of the first active layer of the first transistor T1 to the seventh active layer of the seventh transistor T7 are all made to be conductive.

(4) A second gate metal layer is formed.

In some exemplary implementation, a second insulation thin film and a second metal thin film are sequentially deposited on the base substrate where the aforementioned structures are formed, and the second metal thin film is patterned through a patterning process to form a second insulation layer covering the first gate metal layer, and the second gate metal layer arranged on the second insulation layer in the first display region.

(5) A third insulation layer and a first source-drain metal layer are formed.

In some exemplary implementations, a third insulation thin film is deposited on the base substrate on which the aforementioned structures are formed, and the third insulation layer is formed through a patterning process. The third insulation layer is provided with multiple vias. Subsequently a third metal thin film is deposited and patterned by a patterning process to form a first source-drain metal layer arranged on the third insulation layer of the first display region. In this example, the first source-drain metal layer is the aforementioned first conductive layer.

(6) A fourth insulation layer and a second source-drain metal layer are formed.

In some exemplary implementations, a fourth insulation thin film is coated on the base substrate on which the aforementioned structures are formed, and a fourth insulation layer is formed through a patterning process. Subsequently a fourth metal thin film is deposited and patterned by a patterning process to form the second source-drain metal layer arranged on the fourth insulation layer of the first display region. In some examples, the fourth insulation layer may also be referred to as a first planarization layer. In this example, the second source-drain metal layer is the aforementioned second conductive layer.

(7) A second planarization layer and a first transparent conductive layer are formed.

In some exemplary implementations, a second planarization thin film is coated on the base substrate on which the aforementioned structures are formed, and the second planarization layer is formed through a patterning process. Subsequently, a first transparent conductive thin film is deposited, and the first transparent conductive film is patterned by a patterning process to form a first transparent conductive layer arranged on the second planarization layer.

(8) A third planarization layer and a second transparent conductive layer are formed.

In some exemplary implementations, a third planarization thin film is coated on the base substrate on which the aforementioned structures are formed, and the third planarization layer is formed through a patterning process. Subsequently, a second transparent conductive thin film is deposited, and the second transparent conductive thin film is patterned by a patterning process to form the second transparent conductive layer arranged on the third planarization layer.

(9) A fourth planarization layer and a third transparent conductive layer are formed.

In some exemplary implementations, a fourth planarization thin film is coated on the base substrate on which the aforementioned structures are formed, and the fourth planarization thin film is patterned through a patterning process to form a fourth planarization layer. Subsequently, a third transparent conductive thin film is deposited, and the third transparent conductive thin film is patterned by a patterning process to form the third transparent conductive layer arranged on the fourth planarization layer.

(10) A fifth planarization layer and an anode layer are formed.

In some exemplary implementations, a fifth planarization thin film is coated on the base substrate on which the aforementioned structures are formed, and the fourth planarization thin film is patterned through a patterning process to form the fifth planarization layer. Subsequently, an anode conductive thin film is deposited and then patterned through a patterning process to form an anode layer arranged on fifth planarization layer.

In some exemplary implementations, the base substrate with the above-mentioned patterns formed is coated with a pixel definition thin film. A Pixel Define Layer (PDL) is formed by masking, exposure and development processes. The pixel define layer is formed with a plurality of pixel openings exposing the anode layer. An organic light emitting layer is formed in the aforementioned pixel openings, and the organic light emitting layer is connected to an anode. Then, a cathode thin film is deposited and patterned through a patterning process to form a pattern of a cathode. The cathode is electrically connected to the organic light emitting layer and the second power supply line respectively. Then, an encapsulation layer is formed on the cathode. The encapsulation layer may include a stacked structure of inorganic material/organic material/inorganic material.

In some exemplary implementations, the first gate metal layer, the second gate metal layer, the first source-drain metal layer and the second source-drain metal layer may be made of metal materials, such as any one or more of silver (Ag), copper (Cu), aluminum (Al) and molybdenum (Mo), or an alloy material of the aforementioned metals, such as aluminum neodymium alloy (AlNd) or molybdenum niobium alloy (MoNb), and may be in a single-layer structure, or a multi-layer composite structure, such as Mo/Cu/Mo, etc. The first transparent conductive layer to the third transparent conductive layer may be made of a transparent conductive material such as ITO. The first insulation layer, the second insulation layer, and the third insulation layer may be made of any one or more of Silicon Oxide (SiOx), Silicon Nitride (SiNx), and Silicon Oxynitride (SiON), and may be in a single layer, multiple layers, or in a composite layer. The first planarization layer to the fifth planarization layer may be made of an organic material, such as polyimide, acrylic, or polyethylene terephthalate. The pixel define layer may be made of an organic material, such as polyimide, acrylic, or polyethylene terephthalate. The anode layer may be made of a reflective material such as a metal, and the cathode may be made of a transparent conductive material. However, this embodiment is not limited thereto.

The structure and the manufacturing process of the display substrate of this embodiment are merely illustrative. In some exemplary implementations, a corresponding structure may be changed and a patterning process may be added or reduced according to actual needs. For example, one or two transparent conductive layers may be arranged. For another example, the second conductive layer may be made of a transparent conductive material to avoid the reflection and focusing effects in the preparation process of the transparent conductive layer. However, this embodiment is not limited thereto.

The manufacturing process of this exemplary embodiment may be implemented using an existing mature manufacturing equipment, and may be compatible well with an existing manufacturing process, simple in process implementation, easy to implement, high in a production efficiency, low in production cost, and high in yield rate.

At least one embodiment of the present disclosure further provides a method for manufacturing a display substrate, including: forming a first conductive layer on the base substrate; forming a first planarization layer on a side of the first conductive layer away from the base substrate; forming a second conductive layer on a side of the first planarization layer away from the base substrate, wherein the second conductive layer is electrically connected with the first conductive layer through at least one first via penetrating the first planarization layer; forming a second planarization layer on a side of the second conductive layer away from the base substrate; and forming at least one transparent conductive layer on a side of the second planarization layer away from the base substrate. The at least one transparent conductive layer includes at least one first transparent conductive line and at least one auxiliary trace. An orthographic projection of the at least one first transparent conductive line on the base substrate is overlapped with an orthographic projection of the at least one first via on the base substrate. At least a portion of the at least one auxiliary trace is in a same direction as an extension direction of the at least one first transparent conductive line, and an orthographic projection of an auxiliary trace on the base substrate is adjacent to an orthographic projection of a first via on the base substrate.

For the method for manufacturing the display substrate in this embodiment, reference may be made to descriptions of the aforementioned embodiments, and thus will not be repeated here.

At least one embodiment of the present disclosure also provides a display apparatus which includes the display substrate as described above.

Figure 21:
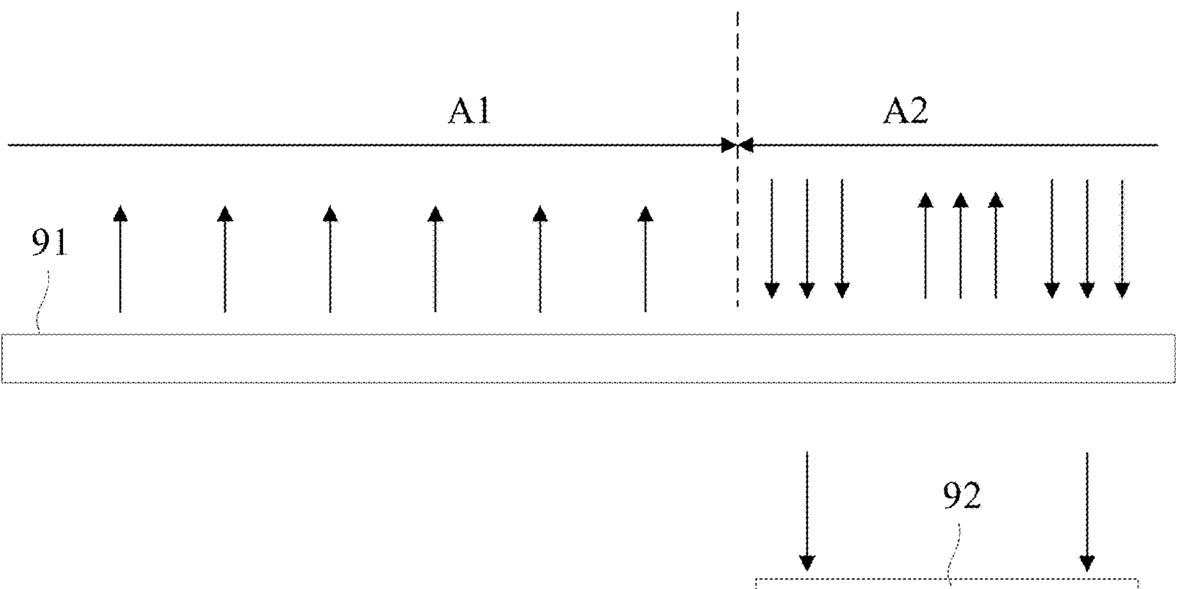
FIG. 21 is a schematic diagram of a display apparatus according to at least one embodiment of the present disclosure.

FIG. 21 is a schematic diagram of a display apparatus according to at least one embodiment of the present disclosure. As shown in FIG. 21, a display apparatus is provide in this embodiment, which includes a display substrate 91 and a photosensitive sensor 92 located on a light exiting side of a display structure layer away from the display substrate 91. An orthographic projection of the photosensitive sensor 92 on the display substrate 91 is overlapped with the second display region A2.

In some exemplary implementations, the display substrate 91 may be a flexible OLED display substrate, a QLED display substrate, a Micro-LED display substrate, or a Mini-LED display substrate. The display apparatus may be any product or component with a display function such as an OLED display, a cell phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments of the present disclosure, i.e., features in the embodiments, may be combined with each other to obtain new embodiments if there is no conflict.

Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising:

a base substrate;

a first conductive layer located on the base substrate;

a first planarization layer located on a side of the first conductive layer away from the base substrate;

a second conductive layer located on a side of the first planarization layer away from the base substrate and electrically connected with the first conductive layer through at least one first via penetrating the first planarization layer;

a second planarization layer located on a side of the second conductive layer away from the base substrate; and at least one transparent conductive layer located on a side of the second planarization layer away from the base substrate;

wherein the at least one transparent conductive layer comprises: at least one first transparent conductive line and at least one auxiliary trace, and an orthographic projection of the at least one first transparent conductive line on the base substrate is overlapped with an orthographic projection of the at least one first via on the base substrate; and at least a portion of the at least one auxiliary trace is in a same direction as an extension direction of the at least one first transparent conductive line, and an orthographic projection of an auxiliary trace of the at least one auxiliary trace on the base substrate is adjacent to an orthographic projection of a first via of the at least one first via on the base substrate;

wherein the at least one transparent conductive layer comprises a first transparent conductive layer which further comprises at least one third anode connection electrode, and the at least one auxiliary trace comprises a first auxiliary trace, wherein the first auxiliary trace and the third anode connection electrode are in an integral structure, and the third anode connection electrode is configured to be electrically connected with a second anode connection electrode of the second conductive layer.

2. The display substrate according to claim 1, wherein a length of the auxiliary trace along the extension direction is greater than an aperture of the first via along the extension direction.

3. The display substrate according to claim 1, wherein in the extension direction, a spacing between edges of the auxiliary trace and of the first via at a same side is less than 5 microns.

4. The display substrate according to claim 1, wherein an absolute value of a difference between a line width of the at least one auxiliary trace along an intersection direction of the extension direction and a line width of the at least one first transparent conductive line along the intersection direction of the extension direction is less than or equal to 0.3 microns.

5. The display substrate according to claim 1, wherein a first spacing is formed between the at least one auxiliary trace and the at least one first transparent conductive line in an intersection direction of the extension direction, and an absolute value of a difference between the first spacing and a line width of the at least one first transparent conductive line along the intersection direction of the extension direction is less than or equal to 0.35 microns.

6. The display substrate according to claim 1, wherein a length of the at least one auxiliary trace along the extension direction is 13.5 microns to 16.5 microns; a line width of the at least one auxiliary trace along an intersection direction of the extension direction is 1.9 microns to 2.4 microns; and a first spacing between the at least one auxiliary trace and the at least one first transparent conductive line is 2.1 microns to 2.6 microns along the intersection direction of the extension direction.

7. The display substrate according to claim 1, wherein an orthographic projection of an end of the at least one auxiliary trace in the extension direction on the base substrate has a circular arc shape.

8. The display substrate according to claim 1, wherein the at least one transparent conductive layer further comprises a second transparent conductive layer located on a side of the at least one first transparent conductive layer away from the base substrate; and the second transparent conductive layer comprises a second auxiliary trace and at least one fourth anode connection electrode, and the second auxiliary trace and the at least one fourth anode connection electrode are in an integral structure; and the at least one transparent conductive layer further comprises: a third transparent conductive layer located on a side of the second transparent conductive layer away from the base substrate; and the third transparent conductive layer comprises a third auxiliary trace and at least one fifth anode connection electrode, and the third auxiliary trace and the at least one fifth anode connection electrode are in an integral structure.

9. The display substrate according to claim 1, wherein the at least one transparent conductive layer further comprises a plurality of adjacent second transparent conductive lines;

an orthographic projection of the plurality of second transparent conductive lines on the base substrate is overlapped with an orthographic projection of the second conductive layer on the base substrate;

the plurality of second transparent conductive lines comprise two marginal transparent conductive lines and at least one non-marginal transparent conductive line, wherein the at least one non-marginal transparent conductive line is located between the two marginal transparent conductive lines; and a line width of a marginal transparent conductive line along an intersection direction of the extension direction is larger than a line width of a non-marginal transparent conductive line along the intersection direction of the extension direction.

10. The display substrate according to claim 9, wherein an absolute value of a difference between the line width of the marginal transparent conductive line along the intersection direction of the extension direction and the line width of the non-marginal transparent conductive line along the intersection direction of the extension direction is 0.3 microns to 0.5 microns; and the line width of the marginal transparent conductive line along the intersection direction of the extension direction is 2.0 microns to 2.5 microns, and the line width of the non-marginal transparent conductive line along the intersection direction of the extension direction is 1.8 microns to 2.2 microns.

11. The display substrate according to claim 9, wherein the at least one transparent conductive layer further comprises at least one third transparent conductive line, and an orthographic projection of the at least one third transparent conductive line on the base substrate is overlapped with the orthographic projection of the second conductive layer on the base substrate, and a spacing between the orthographic projection of the at least one third transparent conductive line on the base substrate and an orthographic projection of other transparent conductive lines on the base substrate is greater than 4 microns; and a line width of a third transparent conductive line along the intersection direction of the extension direction is larger than the line width of the marginal transparent conductive line along the intersection direction of the extension direction.

12. The display substrate according to claim 1, wherein the at least one transparent conductive layer further comprises at least one fourth transparent conductive line and at least one fifth transparent conductive line; and a line length of the at least one fourth transparent conductive line along the extension direction is larger than a line length of the at least one fifth transparent conductive line along the extension direction, and a line width of a fourth transparent conductive line of the at least one fourth transparent conductive line along an intersection direction of the extension direction is smaller than a line width of a fifth transparent conductive line of the at least one fifth transparent conductive line along the intersection direction of the extension direction.

13. The display substrate according to claim 12, wherein an orthographic projection of the fourth transparent conductive line on the base substrate is overlapped with an orthographic projection of a first number of first vias on the base substrate, and an orthographic projection of the fifth transparent conductive line on the base substrate is overlapped with an orthographic projection of a second number of first vias on the base substrate, wherein the first number is greater than the second number; and a ratio of a length of an overlapping region in the intersection direction of the extension direction to the line width of the transparent conductive line along the intersection direction of the extension direction is greater than or equal to 0.5, wherein the overlapping region is a region where an orthographic projection of any one of the fourth transparent conductive line and the fifth transparent conductive line on the base substrate is overlapped with an orthographic projection of the first vias on the base substrate.

14. The display substrate according to claim 12, wherein an overlapping area between an orthographic projection of the fourth transparent conductive line on the base substrate and an orthographic projection of the second conductive layer on the base substrate is greater than an overlapping area between an orthographic projection of the fifth transparent conductive line on the base substrate and an orthographic projection of the second conductive layer on the base substrate.

15. The display substrate according to claim 1, wherein a material of the second conductive layer is a transparent conductive material; or the second conductive layer comprises a shielding electrode electrically connected to a first power supply line, and an orthographic projection of the shielding electrode on the base substrate is configured to cover an orthographic projection of a first node of a pixel circuit of the display substrate on the base substrate; and the orthographic projection of the shielding electrode on the base substrate has a regular shape.

16. The display substrate according to claim 15, wherein an orthographic projection of the shielding electrode on the base substrate is a rectangle or a rounded rectangle; or shielding electrodes of adjacent pixel circuits are in an integral structure.

17. The display substrate according to claim 1, wherein the display substrate comprises a first display region and a second display region, the first display region at least partially surrounds the second display region; and the display substrate further comprises a plurality of sub-pixels, wherein at least one sub-pixel comprises a pixel circuit and a light emitting element, the pixel circuit is configured to drive the light emitting element, and the plurality of sub-pixels comprise at least one first sub-pixel and at least one second sub-pixel, wherein a pixel circuit and a light emitting element of the at least one first sub-pixel are located in the first display region, a pixel circuit of the at least one second sub-pixel is located in the first display region, a light emitting element of the at least one second sub-pixel is located in the second display region, and the pixel circuit of the at least one second sub-pixel is electrically connected with the light emitting element of the at least one second sub-pixel through the at least one transparent conductive layer.

18. A display apparatus, comprising the display substrate according to claim 1.

19. A method for manufacturing a display substrate, comprising:

forming a first conductive layer on the base substrate;

forming a first planarization layer on a side of the first conductive layer away from the base substrate;

forming a second conductive layer on a side of the first planarization layer away from the base substrate, wherein the second conductive layer is electrically connected with the first conductive layer through at least one first via penetrating the first planarization layer;

forming a second planarization layer on a side of the second conductive layer away from the base substrate; and forming at least one transparent conductive layer on a side of the second planarization layer away from the base substrate;

wherein the at least one transparent conductive layer comprises: at least one first transparent conductive line and at least one auxiliary trace, and an orthographic projection of the at least one first transparent conductive line on the base substrate is overlapped with an orthographic projection of the at least one first via on the base substrate; and at least a portion of the at least one auxiliary trace is in a same direction as an extension direction of the at least one first transparent conductive line, and an orthographic projection of an auxiliary trace of the at least one auxiliary trace on the base substrate is adjacent to an orthographic projection of a first via of the at least one first via on the base substrate;

wherein the at least one transparent conductive layer comprises a first transparent conductive layer which further comprises at least one third anode connection electrode, and the at least one auxiliary trace comprises a first auxiliary trace, wherein the first auxiliary trace and the third anode connection electrode are in an integral structure, and the third anode connection electrode is configured to be electrically connected with a second anode connection electrode of the second conductive layer.

* * * * *